(12) United States Patent
Zhou et al.

(10) Patent No.: US 12,408,432 B2
(45) Date of Patent: Sep. 2, 2025

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yang Zhou, Beijing (CN); Linhong Han, Beijing (CN); Huijuan Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 440 days.

(21) Appl. No.: 17/789,170

(22) PCT Filed: Sep. 2, 2021

(86) PCT No.: PCT/CN2021/116288
§ 371 (c)(1),
(2) Date: Jun. 25, 2022

(87) PCT Pub. No.: WO2022/088980
PCT Pub. Date: May 5, 2022

(65) Prior Publication Data
US 2023/0029861 A1    Feb. 2, 2023

(30) Foreign Application Priority Data
Oct. 29, 2020 (CN) .......................... 202011187330.8

(51) Int. Cl.
*H10D 86/40* (2025.01)
*G09G 3/3233* (2016.01)
(Continued)

(52) U.S. Cl.
CPC ......... *H10D 86/411* (2025.01); *G09G 3/3233* (2013.01); *H10K 71/00* (2023.02);
(Continued)

(58) Field of Classification Search
CPC ............. H10K 59/131; H10K 59/1201; G09G 3/3233; G09G 2300/0426; G09G 2300/0819; G09G 2300/0842
See application file for complete search history.

(56) References Cited

U.S. PATENT DOCUMENTS

2008/0117497 A1* 5/2008 Shimodaira ........... G02F 1/1345
361/748
2016/0276493 A1* 9/2016 Yamazaki ......... H01L 29/78672

FOREIGN PATENT DOCUMENTS

| CN | 108598139 A | 9/2018 |
| CN | 109449167 A | 3/2019 |

(Continued)

OTHER PUBLICATIONS

Office Action dated Jul. 5, 2025 for CN202011187330.8 and English Translation.

*Primary Examiner* — Timor Karimy
(74) *Attorney, Agent, or Firm* — Ling Wu; Stephen Yang; Ling and Yang Intellectual Property

(57) ABSTRACT

Provided is a display substrate, including a capacitance compensation region which is provided with a first capacitance compensation unit. The first capacitance compensation unit includes a semiconductor structure, a first metal structure, and a second metal structure sequentially arranged on a base substrate. An insulation layer between the semiconductor structure and the second metal structure is provided with a plurality of first via holes that are arranged along a first direction, and the second metal structure is connected to the semiconductor structure by means of the plurality of first via holes. The first metal structure includes a plurality of (Continued)

second gate lines extending along the first direction. In a second direction perpendicular to the first direction, a distance between two adjacent first via holes is at least greater than a sum of widths of two second gate lines.

18 Claims, 13 Drawing Sheets

(51) Int. Cl.
 *H10K 59/131* (2023.01)
 *H10K 71/00* (2023.01)
 H10K 59/12 (2023.01)
(52) U.S. Cl.
 CPC ............... *G09G 2300/0426* (2013.01); *G09G 2300/0819* (2013.01); *G09G 2300/0842* (2013.01); *H10K 59/1201* (2023.02); *H10K 59/131* (2023.02)

(56) References Cited

FOREIGN PATENT DOCUMENTS

| | | | |
|---|---|---|---|
| CN | 110459572 A | | 11/2019 |
| DE | 3 477 705 | * | 1/2019 |

* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Phase Entry of International Application No. PCT/CN2021/116288 having an international filing date of Sep. 2, 2021, which claims priority to Chinese Patent Application No. 202011187330.8 filed to the China National Intellectual Property Administration (CNIPA) on Oct. 29, 2020 and entitled "Display Substrate and Preparation Method thereof, and Display apparatus". The entire contents of the above-identified applications are hereby incorporated by reference.

TECHNICAL FIELD

The present disclosure relates to, but is not limited to, the field of display technologies, and more particularly, to a display substrate and a preparation method thereof, and a display apparatus.

BACKGROUND

With rapid development of display technologies, consumers have higher and higher requirements for appearance of a display apparatus. Many display panels have changed from a traditional square to a currently popular special-shaped structure, such as a rounded corner of a display region, a special-shaped notch of a display region, and the special-shaped structure is undoubtedly a challenge to manufacturers. For example, a special-shaped display screen with a notch design (for example, a "bangs" screen) is increasingly being used by mobile phone manufacturers. Such a special-shaped display screen is beneficial to acquisition of a higher screen to body ratio, and the notch design in the display screen can reserve design space for a component, such as a front camera. However, such a notch design will lead to occurrence of a difference between gate line signals of pixels on both sides of a notch and gate line signals of pixels in other display regions, this difference may result in a problem of display unevenness (Mura).

SUMMARY

The following is a summary of subject matters described herein in detail. The summary is not intended to limit the protection scope of claims.

The present disclosure provides a display substrate and a preparation method thereof, and a display apparatus.

In one aspect, the present disclosure provides a display substrate including a display region, a notch region, and a capacitance compensation region. The display region at least partially surrounds the notch region, and the capacitance compensation region is located between the display region and the notch region. A plurality of first gate lines are provided in the display region. A first capacitance compensation unit is provided in the capacitance compensation region. The first capacitance compensation unit includes a semiconductor structure, a first metal structure, and a second metal structure disposed on a base substrate sequentially. The semiconductor structure and the first metal structure are insulated from each other, and the first metal structure and the second metal structure are insulated from each other. A plurality of first vias are provided in an insulation layer between the semiconductor structure and the second metal structure, and the second metal structure is connected with the semiconductor structure through the plurality of first vias. The first metal structure includes a plurality of second gate lines extending along a first direction, and at least one of the second gate lines is connected with a corresponding first gate line; an orthographic projection of a second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate; the second gate line forms a capacitor together with the second metal structure and the semiconductor structure. The plurality of first vias are arranged along the first direction, and in a second direction perpendicular to the first direction, a distance between two adjacent first vias is at least greater than a sum of widths of two second gate lines.

In another aspect, the present disclosure provides a display apparatus including the display substrate described above.

In another aspect, the present disclosure provides a preparation method of a display substrate. The display substrate includes a display region, a notch region, and a capacitance compensation region, the display region at least partially surrounds the notch region, and the capacitance compensation region is located between the display region and the notch region. The preparation method includes: providing a base substrate; and in the capacitance compensation region located between the display region and the notch region, forming a semiconductor structure, a first metal structure, and a second metal structure on the base substrate sequentially. The semiconductor structure and the first metal structure are insulated from each other, and the first metal structure and the second metal structure are insulated from each other. A plurality of first vias are provided in an insulation layer between the semiconductor structure and the second metal structure, and the second metal structure is connected with the semiconductor structure through the plurality of first vias. The first metal structure includes a plurality of second gate lines extending along a first direction, and the second gate lines are respectively connected with a plurality of first gate lines in the display region; an orthographic projection of a second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate; the second gate line forms a capacitor together with the second metal structure and the semiconductor structure. The plurality of first vias are arranged along the first direction, and in a second direction perpendicular to the first direction, a distance between two adjacent first vias is at least greater than a sum of widths of two second gate lines.

Other aspects will become apparent upon reading and understanding of drawings and detailed description.

BRIEF DESCRIPTION OF DRAWINGS

The drawings are intended to provide an understanding of technical solutions of the present disclosure and constitute a part of the specification, they are used for explaining the technical solutions of the present disclosure together with embodiments of the present disclosure, and do not constitute a limitation to the technical solutions of the present disclosure.

DETAILED DESCRIPTION

Figure 1:
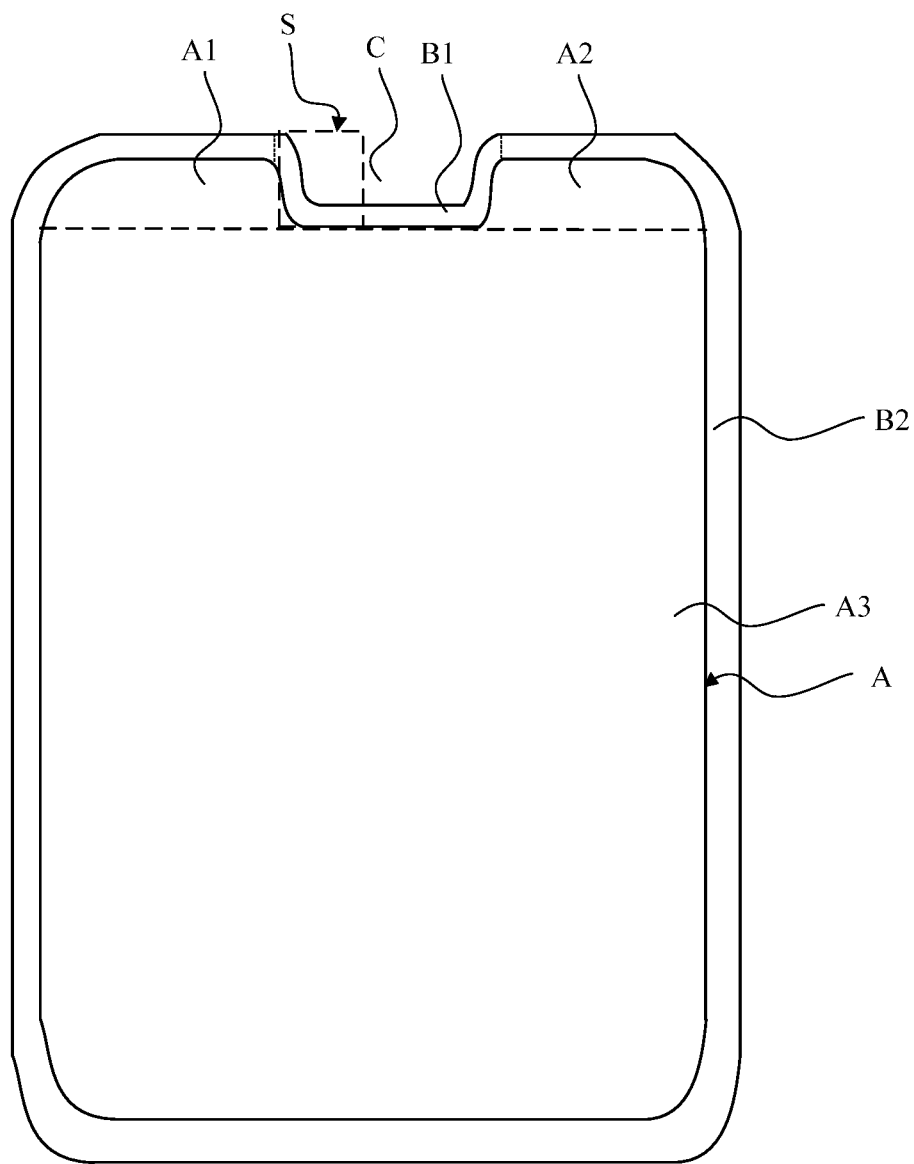
FIG. 1 is a schematic diagram of a structure of a display substrate according to at least one embodiment of the present disclosure.

Multiple embodiments are described in the present disclosure, but the description is exemplary rather than restrictive. Moreover, it is apparent to those of ordinary skills in the art that there may be more embodiments and implementation solutions within the scope contained by the embodiments described in the present disclosure. Although many possible combinations of features are shown in the drawings and discussed in the implementation modes, many other combination modes of disclosed features are also possible. Unless specifically limited, any feature or element of any embodiment may be used in combination with any other feature or element in any other embodiment, or may be substituted for any other feature or element in any other embodiment.

Combinations of features and elements known to those of ordinary skills in the art are included and conceived in the present disclosure. The embodiments, features, and elements disclosed in the present disclosure may also be combined with any conventional feature or element to form a unique technical solution defined by the claims. Any feature or element of any embodiment may also be combined with features or elements from other technical solutions to form another unique technical solution defined by the claims. Therefore, it should be understood that any feature shown or discussed in the present disclosure may be implemented independently or in any appropriate combination. Therefore, the embodiments are not subject to other restrictions except restrictions made according to the appended claims and equivalents thereof. In addition, one or more modifications and alterations may be made within the protection scope of the appended claims.

In addition, when a representative embodiment is described, a method or a process may have been already presented as a specific order of acts in the specification. However, the method or the process should not be limited to the acts in the specific order to an extent that the method or the process does not depend on the specific order of acts described herein. Those of ordinary skills in the art will understand that other orders of acts may also be possible. Therefore, the specific order of acts set forth in the specification should not be interpreted as a limitation to the claims. In addition, the claims with respect to the method or the process should not be limited to execution of their acts in a written order. Those skilled in the art may easily understand that these orders may change, and still remain within the spirit and scope of the embodiments of the present disclosure.

Implementation modes will be described below with reference to the drawings. The implementation modes may be implemented in multiple different forms. Those of ordinary skills in the art may readily understand such a fact that modes and contents thereof may be transformed into different forms without departing from the purpose and scope of the present disclosure. Therefore, the present disclosure should not be interpreted as being limited to contents recorded in following implementation modes only.

In the drawings, sometimes for the sake of clarity, a size of each constituent element, a thickness of a layer, or a region may be exaggerated. Therefore, one mode of the present disclosure is not necessarily limited to the size, and a shape and a size of each component in the drawings do not reflect a true proportion. In addition, the drawings schematically illustrate ideal examples, and one mode of the present disclosure is not limited to shapes or numerical values shown in the drawings.

Ordinal numerals such as "first", "second", "third" and the like in the specification are set to avoid confusion of constituent elements, but not to set a limit in quantity. In the present disclosure, "a plurality of" may refer to two or more than two.

In the present disclosure, for convenience, wordings such as "middle", "upper", "lower", "front", "back", "vertical", "horizontal", "top", "bottom", "inside", "outside", and the like indicating orientation or positional relationships are used for illustrating positional relationships between the constituent elements with reference to the drawings, and are intended to facilitate description of the specification and simplification of the description, but not to indicate or imply that device referred apparatus or element must have a specific orientation or be constructed and operated in a specific orientation, therefore, they should not be understood as a limitation to the present disclosure. It may be understood that when an element such as a layer, a film, a region, or a substrate is described as being "on" or "under" another element, the element may be "directly" located "on" or "under" the another element, or there may be an intermediate element in between. The positional relationships of the constituent elements are appropriately changed according to a direction in which each constituent element is described. Therefore, words and phrases used in the specification are not limited and appropriate substitutions may be made according to a situation.

In the present disclosure, terms such as "connected", "coupled", "linked", or the like are not limited to a physical or mechanical connection, but may include an electrical connection, whether direct or indirect. An "electrical connection" includes a case where constituent elements are connected together through an element with some electrical action. The "element with some electrical action" is not particularly limited as long as electrical signals may be sent and received between the connected constituent elements. Examples of the "element with some electrical action" not only include electrodes and wirings, but also include switching elements such as transistors, resistors, inductors, capacitors, other elements with one or more functions, etc.

In the present disclosure, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is −80° or more and 100° or less, and thus also includes a state in which the angle is −85° or more and 95° or less.

In the present disclosure, a "film" and a "layer" may be interchangeable. For example, sometimes a "conductive layer" may be replaced by a "conductive film". Similarly, sometimes an "insulation film" may be replaced by an "insulation layer".

In the present disclosure, a transistor refers to an element which at least includes three terminals of a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the present disclosure, the channel region refers to a region through which the current mainly flows. In a case that transistors with opposite polarities are used or a case that a direction of a current is changed during circuit operation, functions of the "source electrode" and the "drain electrode" are sometimes interchanged. Therefore, the "source electrode" and the "drain electrode" may be interchanged in the present disclosure.

It may be understood by those of skills in the art that transistors used in all the embodiments of the present disclosure may be thin film transistors, or field-effect transistors, or other devices with same characteristics. Illustratively, the thin film transistors used in the embodiments of the present disclosure may be oxide semiconductor transistors. Since a source electrode and a drain electrode of a switching transistor used herein are symmetrical, the source electrode and the drain electrode are interchangeable. In the embodiments of the present disclosure, a control electrode may be a gate electrode. In order to distinguish two electrodes of a transistor except a gate electrode, one of the two electrodes is referred to as a first electrode and the other is referred to as a second electrode. The first electrode may be a source electrode or a drain electrode, and the second electrode may be a drain electrode or a source electrode.

The embodiments of the present disclosure provide a display substrate and a preparation method thereof, and a display apparatus, so as to improve a display effect of the display apparatus.

An embodiment of the present disclosure provides a display substrate including a display region, a notch region, and a capacitance compensation region. The display region at least partially surrounds the notch region, and the capacitance compensation region is located between the display region and the notch region. A plurality of first gate lines is provided in the display region. A first capacitance compensation unit is provided in the capacitance compensation region. The first capacitance compensation unit includes a semiconductor structure, a first metal structure, and a second metal structure disposed on a base substrate sequentially. The semiconductor structure and the first metal structure are insulated from each other, and the first metal structure and the second metal structure are insulated from each other. A plurality of first vias are provided in an insulation layer between the semiconductor structure and the second metal structure, and the second metal structure is connected with the semiconductor structure through the plurality of first vias. The first metal structure includes a plurality of second gate lines extending along a first direction, and at least one of the second gate lines are connected with a corresponding first gate line. An orthographic projection of the second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate. The second gate line forms a capacitor together with the second metal structure and the semiconductor structure. The plurality of first vias are arranged along the first direction, and a distance between two adjacent first vias is at least greater than a sum of widths of two second gate lines in a second direction perpendicular to the first direction.

In the present disclosure, a "width" represents a feature size in a direction perpendicular to an extension direction of a signal line. For example, a width of the second gate line is a length of the second gate line along the second direction.

In the display substrate according to this embodiment, a loading capacitance of a first gate line bypassing the notch region in the display region may be compensated by providing the first capacitance compensation unit in the capacitance compensation region between the display region and the notch region, thereby ensuring display uniformity of the display region. Moreover, the plurality of first vias connecting the semiconductor structure with the second metal structure are arranged along the first direction, and the distance between two adjacent first vias is at least greater than the sum of the widths of two second gate lines in the second direction, so that space occupied by the first capacitance compensation unit may be saved, which is beneficial to reduction in a border size.

In some exemplary implementation modes, the first metal structure includes N second gate lines extending along the first direction, and N is an integer greater than 1. In some examples, N may be determined according to a length of the capacitance compensation region along the second direction and widths of second gate lines. For example, a total width of the N second gate lines is less than the length of the capacitance compensation region along the second direction. In the second direction perpendicular to the first direction, a distance between two adjacent first vias is at least greater than a sum of widths of two second gate lines and less than a sum of widths of the N second gate lines. For example, in the second direction perpendicular to the first direction, the N second gate lines may be used as a group, and the plurality of first vias arranged along the first direction are provided on edges of both opposite sides of the N second gate lines respectively.

In some exemplary implementation modes, the first metal structure includes N second gate lines extending along the first direction, and N is an integer greater than 1. A distance between two adjacent first vias is greater than a sum of widths of the N second gate lines in the second direction perpendicular to the first direction. For example, in the second direction perpendicular to the first direction, two or more than two second gate lines may be used as a group and the plurality of first vias arranged along the first direction are provided on adjacent edges of any two groups of second gate lines. However, this embodiment is not limited thereto.

In some exemplary implementation modes, the semiconductor structure may include at least one semiconductor block. The plurality of first vias may be respectively located on an edge of one side or on edges of both opposite sides of the at least one semiconductor block in the second direction. In some examples, the semiconductor structure may include a plurality of semiconductor blocks arranged in an array. For example, semiconductor blocks located in a middle region of the array of the semiconductor blocks may be in a shape of a rectangle, and semiconductor blocks located in edge regions on both sides of the array in the first direction may be in a shape of a triangle or trapezoid, and long sides of the triangle or trapezoid are adjacent to rectangular semiconductor blocks. Or, the semiconductor structure may include one semiconductor block. However, this embodiment is not limited thereto.

In some exemplary implementation modes, the semiconductor structure includes a plurality of semiconductor blocks arranged along the first direction sequentially, and a length of at least one semiconductor block along the first direction ranges from 10 microns to 300 microns. For example, a length of a semiconductor block along the first direction may be 260 microns. However, this embodiment is not limited thereto.

In some exemplary implementation modes, a width of at least one second gate line included in the first metal structure may be different from a width of an adjacent second gate line. For example, the first metal structure may include a plurality of second gate lines with different widths. However, this embodiment is not limited thereto. In this exemplary implementation mode, in a case that shapes of the semiconductor structure and the second metal structure are fixed, by adjusting a width of a second gate line of the first metal structure, a size of a capacitor formed by the second gate line together with the second metal structure and the semiconductor structure may be adjusted, so as to implement targeted compensation for a loading capacitance of a first gate line connected with the second gate line in the display region.

In some exemplary implementation modes, the orthographic projection of the second metal structure on the base substrate may cover the orthographic projection of the semiconductor structure on the base substrate. However, this embodiment is not limited thereto. In some examples, the orthographic projection of the second metal structure on the base substrate may be partially overlapped with the orthographic projection of the semiconductor structure on the base substrate.

In some exemplary implementation modes, a second capacitance compensation unit may also be provided in the capacitance compensation region. The second capacitance compensation unit may include a third metal structure and a fourth metal layer structure that are disposed on the base substrate sequentially and insulated from each other. The third metal structure and the first metal structure are structures on a same layer, and the fourth metal structure and the second metal structure are structures on a same layer. An orthographic projection of the third metal structure on the base substrate is at least partially overlapped with an orthographic projection of the fourth metal structure on the base substrate, and the third metal structure and the fourth metal structure form a capacitor. In some examples, the second capacitance compensation unit may be located on one side of the first capacitance compensation unit close to the display region. However, this embodiment is not limited thereto.

In some exemplary implementation modes, the second metal structure at least includes a first potential signal line extending along the first direction. For example, the first potential signal line may be a low potential power line (VSS) or a high potential power line (VDD) in the display substrate. However, this embodiment is not limited thereto. In some examples, the first potential signal line may be another trace that provides a low potential signal or another trace that provides a high potential signal. In this embodiment, a high potential and a low potential are not limited, and the high potential and the low potential are relative.

In some exemplary implementation modes, the base substrate may further include a border region located at a periphery of the display region and away from the notch region. A width of a first potential signal line in the capacitance compensation region may be greater than a width of a first potential signal line in the border region. A plurality of positions of the first potential signal line in the border region may be arranged at equal intervals. Widths of a plurality of positions of the first potential signal line in the capacitance compensation region may be different.

In some exemplary implementation modes, the first potential signal line in the capacitance compensation region has a body portion and an extension portion. The main body portion extends along the first direction, the extension portion extends along the second direction, and one end of the extension portion close to the notch region is connected with the main body portion. A length of the extension portion in the first direction gradually increases and then decreases along a direction away from the notch region. However, this embodiment is not limited thereto. In some examples, the length of the extension portion in the first direction increases gradually along the direction away from the notch region, or gradually decreases and then increases.

In some exemplary implementation modes, the second metal structure further includes an extension electrode. The extension electrode is connected with the first potential signal line through a plurality of connection electrodes. In some examples, the first potential signal line is a low potential power line, and the extension electrode is located on one side of the first potential signal line away from the notch region. In some examples, the first potential signal line is a high potential power line, and the extension electrode is located on one side of the first potential signal line close to the notch region. However, this embodiment is not limited thereto. A coverage of the first capacitance compensation unit may be increased by providing the extension electrode in this exemplary implementation mode.

In some exemplary implementation modes, the plurality of connection electrodes may be disposed on a same layer as the first metal structure, or the plurality of connection electrodes may be disposed on a same layer as a first gate line. However, this embodiment is not limited thereto. In some exemplary implementation modes, a plurality of second vias may be provided in an insulation layer between a film layer where the plurality of connection electrodes are located and the second metal structure. The extension electrode and the first potential signal line may be respectively connected with the connection electrodes through the plurality of second vias. The first vias and the second vias may be spaced apart from each other and arranged along the first direction. However, this embodiment is not limited thereto. In some examples, the first vias and the second vias may be respectively arranged along the first direction, and a distance between a first via and a second via may be at least greater than a sum of widths of two second gate lines in the second direction.

In some exemplary implementation modes, a plurality of sub-pixels arranged regularly may be provided in the display region, at least one sub-pixel may include a light emitting element and a drive circuit for driving the light emitting element to emit light, the drive circuit may include a plurality of transistors and a storage capacitor. The display region may include a base substrate, and a semiconductor layer, a first conductive layer, a second conductive layer, and a third conductive layer which are disposed on the base substrate sequentially. The semiconductor layer may include active layers of the plurality of transistors; the first conductive layer may include gate electrodes of the plurality of transistors, a first electrode of the storage capacitor, and a first gate line connected with a gate electrode; the second conductive layer may include a second electrode of the storage capacitor; the third conductive layer may include source electrodes and drain electrodes of the plurality of transistors. The semiconductor structure may be disposed on a same layer as the semiconductor layer, and the first metal structure may be disposed on a same layer as the second conductive layer; the second metal structure may be disposed on a same layer as the third conductive layer. A second gate line included in the first metal structure is connected with a corresponding first gate line in the first conductive layer.

A display substrate according to an embodiment of the present disclosure will be described through some examples.

FIG. 1 is a schematic diagram of a structure of a display substrate according to at least one embodiment of the present disclosure. As shown in FIG. 1, this embodiment provides a display substrate, which may include a display region A, a capacitance compensation region B1, a border region B2, and a notch region C. The notch region C may be located on one side of the display region A. The display region A may extend outward to form the capacitance compensation region B1 and the border region B2, that is, the display region A, the capacitance compensation region B1, and the border region B2 may be continuous regions. The notch region C and the display region A may be two regions which are connected with each other through the capacitance compensation region B1 and are not coincident with each other. The notch region C and the capacitance compensation region B1 may be connected with each other and be not coincident with each other.

In at least one exemplary embodiment, as shown in FIG. 1, the capacitance compensation region B1 may be located on one side of the display region A close to the notch region C, and may be located between the notch region C and the display region A. One side of the display region A away from the notch region C may be surrounded by the border region B2. A shape of the capacitance compensation region B1 and the border region B2 after they are connected is the same as a shape of an outer contour of the display region A. In other words, the capacitance compensation region B1 and the border region B2 are disposed around the outer contour of the display region A after they are connected. For example, in a case that a portion of the outer contour of the display region A is in a shape of a circular arc, a region surrounding the portion of the outer contour may be in a shape of a circular arc with a same radian.

In at least one exemplary embodiment, as shown in FIG. 1, the display region A, the capacitance compensation region B1, the border region B2, and the notch region C may form a closed graph. The closed graph may be a rectangle with rounded corners, and the notch region C may be located at an edge position of the closed graph. In other words, the notch region C may be at least partially surrounded by the display region A. The display substrate shown in FIG. 1 may be used for forming a "bangs" screen. However, this embodiment is not limited thereto. For example, the closed graph may be a circle or a triangle (including a triangle with rounded corners).

In at least one exemplary embodiment, as shown in FIG. 1, the notch region C may be of a notch structure. The display region A may include a first sub-display region A1, a second sub-display region A2, and a third sub-display region A3. The first sub-display region A1, the second sub-display region A2, and the third sub-display region A3 surround the notch region C from three sides respectively to form the notch structure. The first sub-display region A1 and the second sub-display region A2 are located on both opposite sides of the notch region C respectively, and the third sub-display region A3 is located on a same side of the first sub-display region A1, the notch region C, and the second sub-display region A2. The first sub-display region A1 and the second sub-display region A2 are similar to two "ears" of the third sub-display region A3. However, this embodiment is not limited thereto. In some examples, the notch region may be of a closed shape (e.g., a square hole and a round hole) completely surrounded by the display region. The notch region may be, for example, used for reserving design space for a component such as a front camera.

Figure 2:
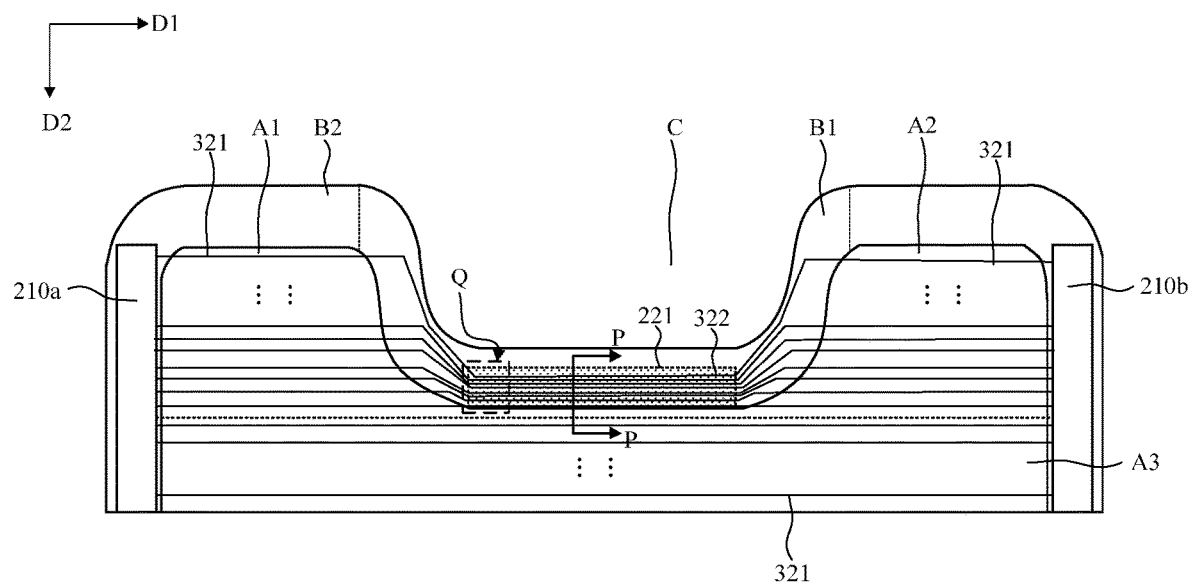
FIG. 2 is a schematic partial view of a display substrate according to at least one embodiment of the present disclosure.

FIG. 2 is a schematic partial view of a display substrate according to at least one embodiment of the present disclosure. As shown in FIGS. 1 and 2, scan drive circuits 210a and 210b may be provided in the border region B2 on both opposite sides of the display region A. A plurality of sub-pixels (not shown) arranged regularly, a plurality of first gate lines 321 connected with the scan drive circuit 210a and extending along a first direction D1, and a plurality of data lines (not shown) extending along a second direction D2 may be provided in the first sub-display region A1. A plurality of sub-pixels (not shown), a plurality of first gate lines 321 connected with the scan drive circuit 210b and extending along the first direction D1, and a plurality of data lines (not shown) extending along the second direction D2 may be provided in the second sub-display region A2. A plurality of second gate lines 322 are provided in the capacitance compensation region B1, the plurality of second gate lines 322 each extending along an extension direction parallel to an edge of one side of the capacitance compensation region B1 close to the display region A. A plurality of sub-pixels (not shown) arranged regularly, a plurality of first gate lines 321 connected with the scan drive circuits 210a and 210b and extending along the first direction D1, and a plurality of data lines (not shown) extending along the second direction D2 may be provided in the third sub-display region A3. The first direction D1 (e.g., a row direction) may be perpendicular to the second direction D2 (e.g., a column direction). At least one sub-pixel may include a light emitting element and a drive circuit for driving the light emitting element to emit light. The drive circuit may include a plurality of transistors and a storage capacitor.

In at least one exemplary embodiment, as shown in FIG. 2, the plurality of first gate lines 321 may be respectively connected with the scan drive circuits 210a and 210b located in the border region B2 of both sides of the display region A. Any one of the scan drive circuits may include a plurality of cascaded shift register cells. In order to facilitate distinguishing between gate lines and rows of sub-pixels, rows are sometimes referred to as a first row, a second row, ..., and an M-th row in order from the top in FIG. 1.

Figure 3:
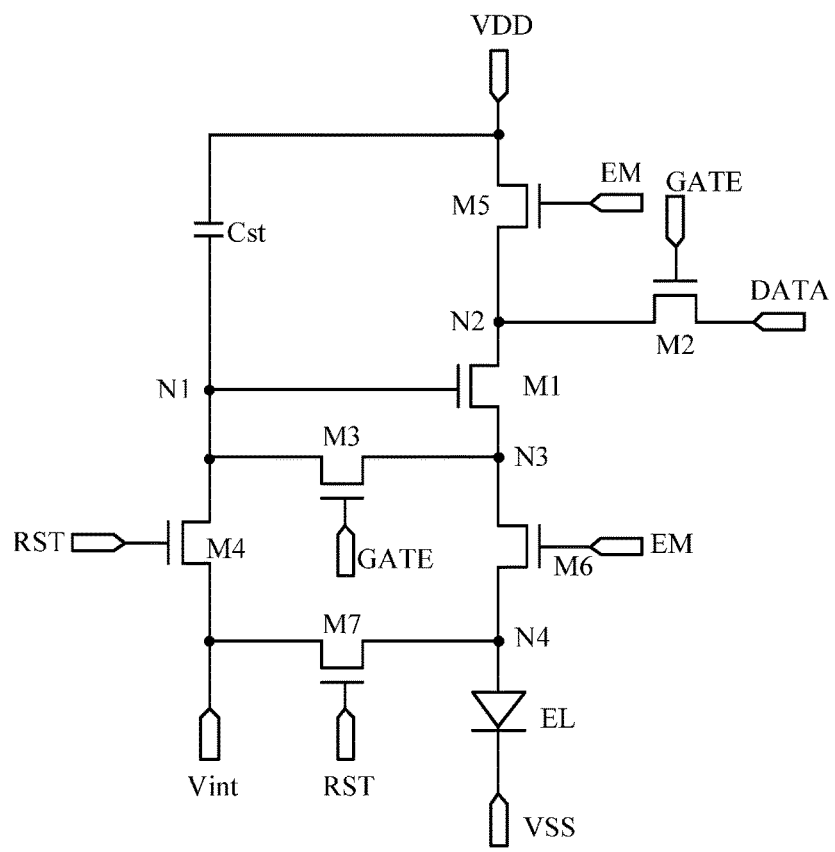
FIG. 3 is an equivalent circuit diagram of a drive circuit of a sub-pixel according to at least one embodiment of the present disclosure.

In some examples, description is given by taking an example of a drive circuit of a sub-pixel including seven transistors and a storage capacitor. FIG. 3 is an equivalent circuit diagram of a drive circuit of a sub-pixel according to at least one embodiment of the present disclosure. As shown in FIG. 3, the drive circuit of this exemplary embodiment includes a first transistor M1 to a seventh transistor M7 and a storage capacitor Cst. The first transistor M1 is a drive transistor. The second transistor M2 to the seventh transistor M7 are all switching transistors.

In this exemplary embodiment, a control electrode of the first transistor M1 is connected with a first node N1, a first electrode of the first transistor M1 is connected with a second node N2, and a second electrode of the first transistor M1 is connected with a third node N3. A control electrode of the second transistor M2 is connected with a scan line GATE, a first electrode of the second transistor M2 is connected with a data line DATA, and a second electrode of the second transistor M2 is connected with the second node N2. A control electrode of the third transistor M3 is connected with the scan line GATE, a first electrode of the third transistor M3 is connected with the first node N1, and a second electrode of the third transistor M3 is connected with the third node N3. A control electrode of the fourth transistor M4 is connected with a reset signal line RST, a first electrode of the fourth transistor M4 is connected with an initial signal line Vint, and a second electrode of the fourth transistor M4 is connected with the first node N1. A control electrode of the fifth transistor M5 is connected with a light emitting control line EM, a first electrode of the fifth transistor M5 is connected with a high potential power line VDD, and a second electrode of the fifth transistor M5 is connected with the second node N2. A control electrode of the sixth transistor M6 is connected with the light emitting control line EM, a first electrode of the sixth transistor M6 is connected with the third node N3, and a second electrode of the sixth transistor M6 is connected with a fourth node N4. A control electrode of the seventh transistor M7 is connected with the reset signal line RST, a first electrode of the seventh transistor M7 is connected with the initial signal line Vint, and a second electrode of the seventh transistor M7 is connected with the fourth node N4. A first electrode of the storage capacitor Cst is connected with the first node N1, and a second electrode of the storage capacitor Cst is connected with a first power line VDD. An anode of a light emitting element EL is connected with the fourth node N4, and a cathode of the light emitting element EL is connected with a low potential power line VSS.

In this exemplary embodiment, first gate lines connected with the scan drive circuits 210a and 210b may include the scan line GATE and the reset signal line RST. For example, a scan line GATE connected with an nth row of sub-pixels may be a first gate line in the nth row, and the reset signal line RST connected with the nth row of sub-pixels may be a first gate line in an (n−1)th row, and n is an integer greater than 1.

A working process of the drive circuit provided in FIG. 3 will be described illustratively below by taking the first transistor M1 to the seventh transistor M7 being P-type thin film transistors as an example. As shown in FIG. 3, the drive circuit involved in this exemplary embodiment includes six switching transistors (M2 to M7), one drive transistor (M1), one capacitor unit (Cst), five signal input terminals (DATA, GATE, EM, RST, and Vint), and two power terminals (VDD and VSS). Illustratively, the high potential power line VDD may provide high-level signals continuously, and the low potential power line VSS may provide low-level signals continuously.

In a reset stage, a high-level signal is inputted by the scan line GATE, and the second transistor M2 and the third transistor M3 are turned off. A high-level signal is inputted by the light emitting control line EM, and the fifth transistor M5 and the sixth transistor M6 are turned off. A low-level signal is inputted by the reset signal line RST, the fourth transistor M4 and the seventh transistor M7 are turned on, and a signal inputted by the initial signal line Vint is provided to the first node N1 and a fourth node N4 to reset the first node N1 and the fourth node N4, thereby eliminating an influence of a signal of a previous frame.

In a writing stage, a high-level signal is inputted by the reset signal line RST, and the fourth transistor M4 and the seventh transistor M7 are turned off. A high-level signal is inputted by the light emitting control line EM, and the fifth transistor M5 and the sixth transistor M6 are turned off. A low-level signal is inputted by the scan line GATE, and the second transistor M2 and the third transistor M3 are turned on. The second transistor M2 is turned on to provide a data signal inputted by the data line DATA to the second node N2, at this time, a potential Vn2 of the second node N2 is Vn2=Vdata, and Vdata is a voltage value of the data signal. The third transistor M3 is turned on to connect the first node N1 with the third node N3, i.e., connect the control electrode of the first transistor M1 with the second electrode of the first transistor M1 to write the data signal transmitted to the second node N2 and a threshold voltage Vth (i.e., a compensation signal) of the first transistor M1 to the first node N1 while charging the storage capacitor Cst, at this time, a potential Vn1 of the first node N1 is Vn1=Vdata-Vth. The data signal may be written to the control electrode of the first transistor M1 and the threshold voltage of the first transistor M1 may be compensated in the writing stage, so as to eliminate an influence of the threshold voltage of the first transistor M1 on a driving current in a light emitting stage.

In the light emitting stage, a high-level signal is inputted by the reset signal line RST, and the fourth transistor M4 and the seventh transistor M7 are turned off. A high-level signal is inputted by the scan line GATE, and the second transistor M2 and the third transistor M3 are turned off. A low-level signal is inputted by the light emitting control line EM, and the fifth transistor M5 and the sixth transistor M6 are turned on. The fifth transistor M5 is turned on to provide a signal inputted by the first power line VDD to the second node N2, at this time, Vn2=Vvdd. The first transistor M1 is turned on under an action of a signal (i.e., the data signal and the compensation signal) of the first node N1, and the driving current is output under an action of the signal provided by the first power line VDD to drive the light emitting element EL to emit light. If the potential of the first node N1 is kept unchanged at Vdata-Vth under an action of the storage capacitor Cst, a source-gate voltage of the first transistor M1 may be: Vsg=Vn2−Vn1=Vvdd−Vdata+Vth.

According to a following transistor I-V curve equation: $I=K(Vsg-Vth)^2=K(Vvdd-Vdata)^2$, wherein K is a fixed constant related to process parameters and geometric dimensions of a drive transistor (i.e., the first transistor M1).

It may be seen that the driving current is independent of the threshold voltage of the first transistor (i.e., the drive transistor), and an influence of the threshold voltage on the light emitting element EL is eliminated, so that display uniformity and a light emitting efficiency may be improved.

Figure 4:
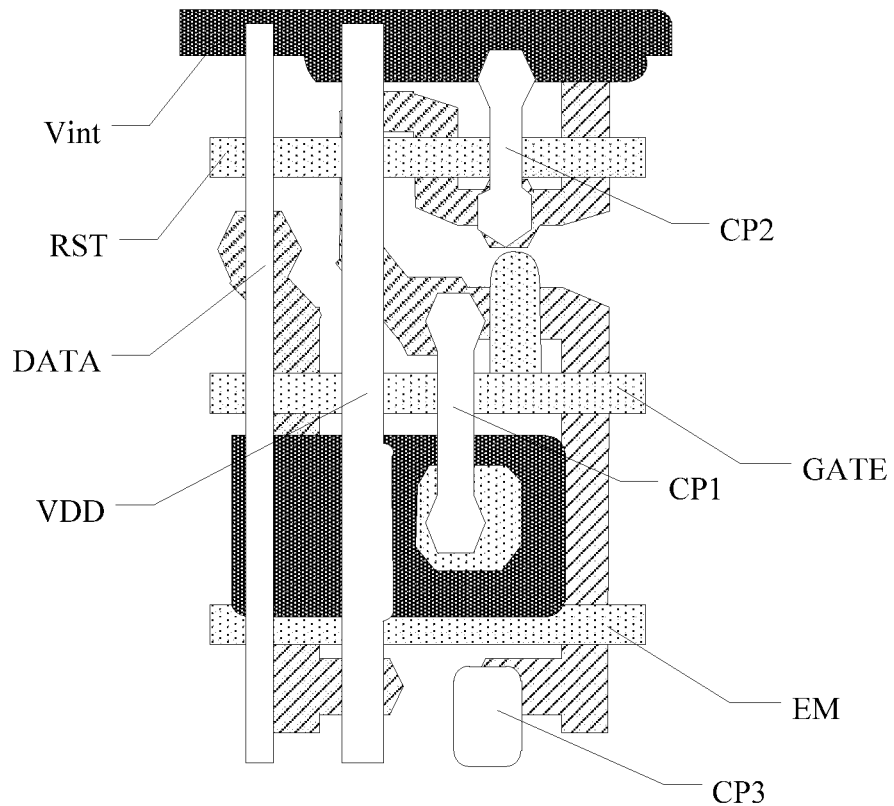
FIG. 4 is a top view of a drive circuit of a sub-pixel according to at least one embodiment of the present disclosure.
Figure 5A:
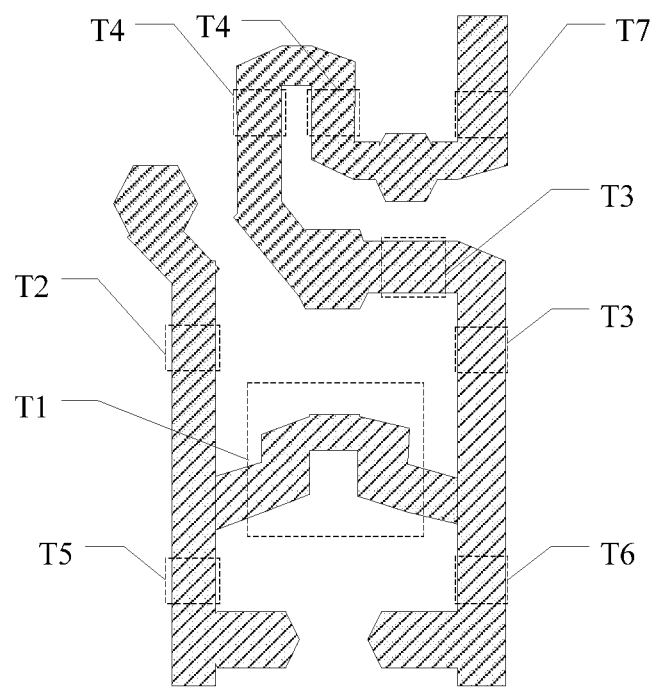
FIG. 5A is a top view of a drive circuit after a semiconductor layer is formed according to at least one embodiment of the present disclosure.
Figure 5B:
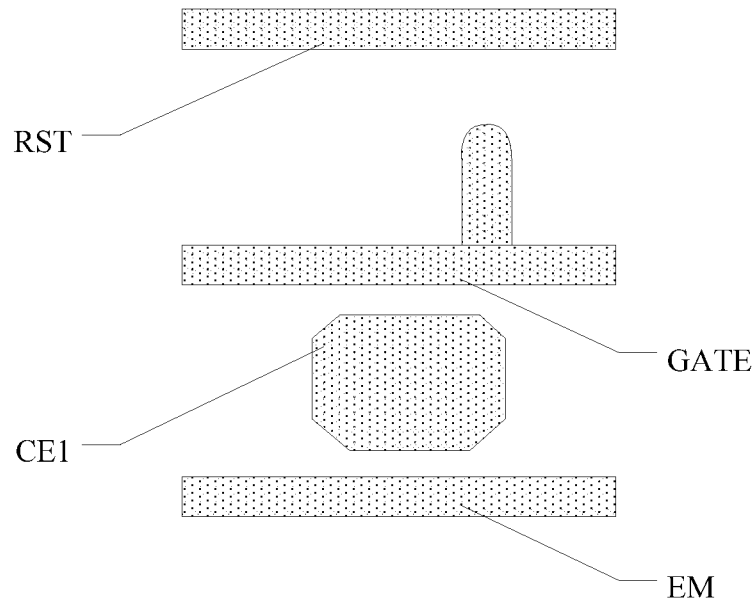
FIG. 5B is a top view of a drive circuit after a first conductive layer is formed according to at least one embodiment of the present disclosure.
Figure 5C:
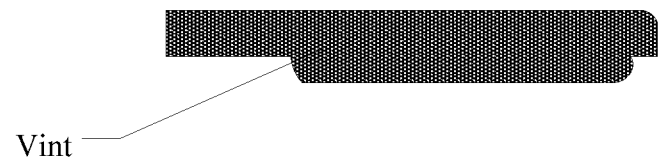
FIG. 5C is a top view of a drive circuit after a second conductive layer is formed according to at least one embodiment of the present disclosure.
Figure 5C:
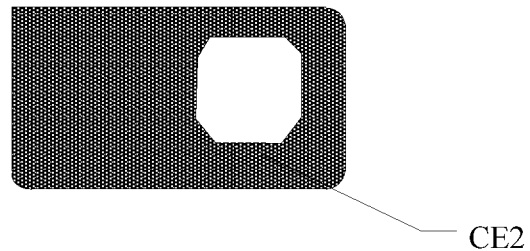
Figure 5D:
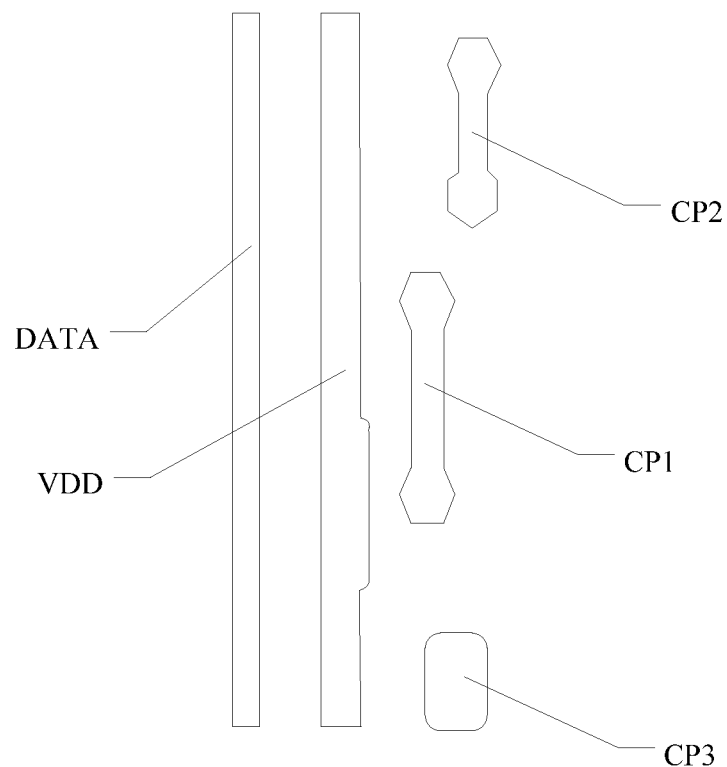
FIG. 5D is a top view of a drive circuit after a third conductive layer is formed according to at least one embodiment of the present disclosure.

In at least one exemplary embodiment, the display region may include a base substrate, and a semiconductor layer, a first conductive layer, a second conductive layer, and a third conductive layer which are disposed on the base substrate sequentially. FIG. 4 is a top view of a drive circuit of a sub-pixel according to at least one embodiment of the present disclosure. FIG. 5A is a top view of the drive circuit after the semiconductor layer is formed according to at least one embodiment of the present disclosure. FIG. 5B is a top view of the drive circuit after the first conductive layer is formed according to at least one embodiment of the present disclosure. FIG. 5C is a top view of the drive circuit after the second conductive layer is formed according to at least one embodiment of the present disclosure. FIG. 5D is a top view of the drive circuit after the third conductive layer is formed according to at least one embodiment of the present disclosure.

In at least one exemplary embodiment, as shown in FIGS. 4 and 5A, the semiconductor layer may include active layers of the first transistor M1 to the seventh transistor M7. At least one active layer may include a channel region, a first doped region, and a second doped region. The channel region may be not doped with impurities, and has characteristics of a semiconductor. The first doped region and the second doped region may be on both sides of the channel region and doped with impurity particles, and thus have conductivity. The impurities may be changed according to a type of a transistor. The first doped region or second doped region of the semiconductor layer may be interpreted as a source electrode or drain electrode of a transistor. For example, a source electrode of a first transistor may correspond to a first doped region doped with impurities at a periphery of a channel region T1 of an active layer; a drain electrode of the first transistor may correspond to a second doped region doped with impurities at the periphery of the channel region T1 of the active layer. In addition, portions of active layers between transistors may be interpreted as wirings doped with impurities, and may be used for electrically connecting the transistors. In FIG. 5A, T1 represents a channel region of an active layer of the first transistor, T2 represents a channel region of an active layer of a second transistor, T3 represents a channel region of an active layer of a third transistor, T4 represents a channel region of an active layer of a fourth transistor, T5 represents a channel region of an active layer of a fifth transistor, T6 represents a channel region of an active layer of a sixth transistor, and T7 represents a channel region of an active layer of a seventh transistor.

In at least one exemplary embodiment, as shown in FIGS. 4 and 5B, the first conductive layer may include a light emitting control line EM, a scan line GATE, a reset signal line RST, and a first electrode CE1 of a storage capacitor Cst. A control electrode (i.e., a gate electrode) of the first transistor M1 and the first electrode CE1 of the storage capacitor Cst are of an integrated structure, i.e., the first electrode CE1 of the storage capacitor Cst serves as the gate electrode of the first transistor M1 at the same time. Gate electrodes of the fourth transistor M4 and the seventh transistor M7 and the reset signal line RST are of an integrated structure. Gate electrodes of the second transistor M2 and the third transistor M3 and the scan line GATE are of an integrated structure. Gate electrodes of the fifth transistor M5 and the sixth transistor M6 and the light emitting control line EM are of an integrated structure. However, this embodiment is not limited thereto.

In at least one exemplary embodiment, as shown in FIGS. 4 and 5C, the second conductive layer may include an initial signal line Vint and a second electrode CE2 of the storage capacitor Cst. The second electrode CE2 has a hollow region. An orthographic projection of the gate electrode of the first transistor M1 on the base substrate may cover an orthographic projection of the hollow region on the base substrate. The orthographic projection of the hollow region on the base substrate may be polygonal. However, this embodiment is not limited thereto.

In at least one exemplary embodiment, as shown in FIGS. 4 and 5D, the third conductive layer may include a data line DATA, a first power line VDD, and a plurality of connection electrodes CP1, CP2, and CP3. The data line DATA and the first power line VDD are parallel to each other. The data line DATA may be connected with the first electrode of the second transistor M2 through an open pore on an insulation layer between the third conductive layer and the semiconductor layer. The first power line VDD may be connected with the first electrode of the fifth transistor M5 through the open pore on the insulation layer between the third conductive layer and the semiconductor layer. The first power line VDD may be connected with the second electrode CE2 of the storage capacitor Cst through an open pore on an insulation layer between the third conductive layer and the second conductive layer. One end of the connection electrode CP1 may be connected with the first electrode CE1 of the storage capacitor Cst through an open pore on an insulation layer between the third conductive layer and the first conductive layer, and an orthographic projection of the open pore on the base substrate is located in the hollow region of the second electrode CE2 of the storage capacitor Cst; the other end of the connection electrode CP1 may be connected with the first electrode of the third transistor M3 through the open pore on the insulation layer between the third conductive layer and the semiconductor layer. One end of the connection electrode CP2 may be connected with the initial signal line Vint through the open pore on the insulation layer between the third conductive layer and the second conductive layer; the other end of the connection electrode CP2 may be connected with the second electrode of the fourth transistor M4 and the first electrode of the seventh transistor M7 through the open pore on the insulation layer between the third conductive layer and the semiconductor layer. One end of the connection electrode CP3 may be connected with the second electrode of the sixth transistor M6 through the open pore on the insulation layer between the third conductive layer and the semiconductor layer; the other end of the connection electrode CP3 may be connected with a second electrode of a seventh transistor in a next row of sub-pixels through the open pore on the insulation layer between the third conductive layer and the semiconductor layer. A light emitting element may include an anode, a light emitting functional layer, and a cathode. For example, the anode may be connected with the connection electrode CP3.

In at least one exemplary embodiment, as shown in FIG. 2, first N first gate lines 321 (i.e., the plurality of first gate lines located in the first sub-display region A1) in order from the top may be correspondingly connected with first N first gate lines 321 in the second sub-display region A2 through the plurality of second gate lines 322 in the capacitance compensation region B1. Any one of the second gate lines 322 in the capacitance compensation region B1 may be connected with first gate lines 321 in a same row in the first sub-display region A1 and the second sub-display region A2. A plurality of first gate lines 321 (e.g. an (N+1)th first gate line to an Mth first gate line) in the third sub-display region A3 may extend in parallel along the first direction D1. Each of the first gate lines 321 may be configured to connect one row of sub-pixels. In some examples, each of the first gate lines may be configured to provide a scan signal to a row of sub-pixels. In some examples, each of the first gate lines may be configured to provide a scan signal to a row of sub-pixels and provide a reset signal to a previous row of sub-pixels. However, this embodiment is not limited thereto.

In at least one exemplary embodiment, as shown in FIG. 2, first gate lines 321 in the first sub-display region A1 and the second sub-display region A2 cannot be directly connected with each other laterally, but their interconnection is achieved by bypassing the notch region C through second gate lines 322 in the capacitance compensation region B1. A density of the second gate lines 322 in the capacitance compensation region B1 is greater than a density of first gate lines 321 in the display region A. Moreover, the second gate lines 322 in the capacitance compensation region B1 may extend along an outer contour of the display region A, that is, extend along a direction parallel to an edge of one side of the display region A close to the capacitance compensation region B1. For example, in a case that a portion of the outer contour of the display region A is circular arc-shaped, the second gate lines 322 in the capacitance compensation region B1 may be formed by connecting a plurality of straight line segments to extend along a shape of the outer contour of the display region A. However, this embodiment is not limited thereto. In some examples, the second gate lines in the capacitance compensation region B1 may include curve segments to extend along the shape of the outer contour of the display region.

In at least one exemplary embodiment, as shown in FIG. 2, due to existence of the notch region C, a portion of sub-pixels are deleted, resulting in a quantity of sub-pixels with which first gate lines 321 distributed in the first sub-display region A1 and the second sub-display region A2 are connected being less than a quantity of sub-pixels with which the first gate lines 321 in the third sub-display region A3 are connected. As such, a loading capacitance of the first gate lines in the first sub-display region A1 and the second sub-display region A2 is less than a loading capacitance on the first gate lines in the third sub-display region A3, further causing data writing time of sub-pixels in the first sub-display region A1 and the second sub-display region A2 to be different from data writing time of sub-pixels in the third sub-display region A3, resulting in display unevenness (Mura), thereby affecting a display effect. In this exemplary embodiment, a missing loading capacitance may be compensated for the first gate lines in the first sub-display region A1 and the second sub-display region A2 by providing a first capacitance compensation unit 221 in the capacitance compensation region B1.

Figure 6:
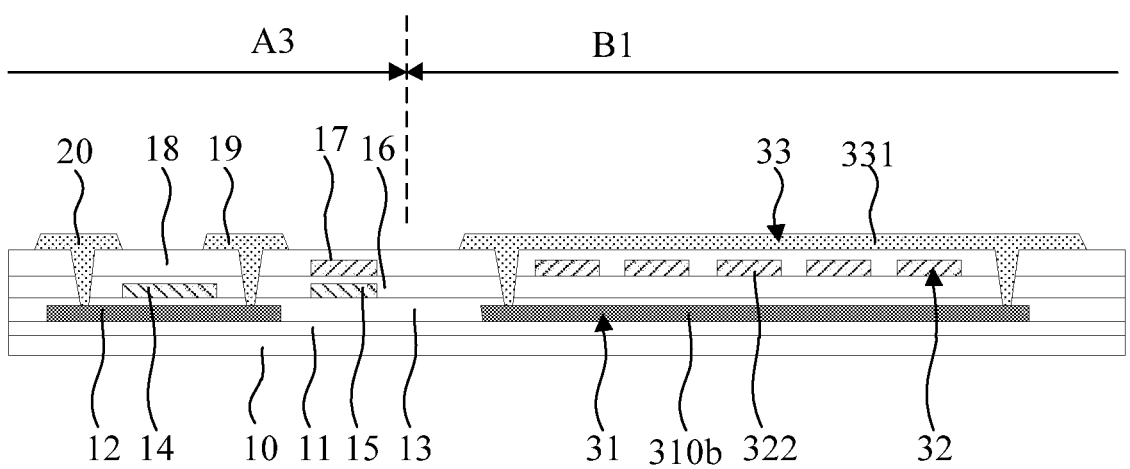
FIG. 6 is a schematic sectional view taken along a P-P direction in FIG. 2.
Figure 7:
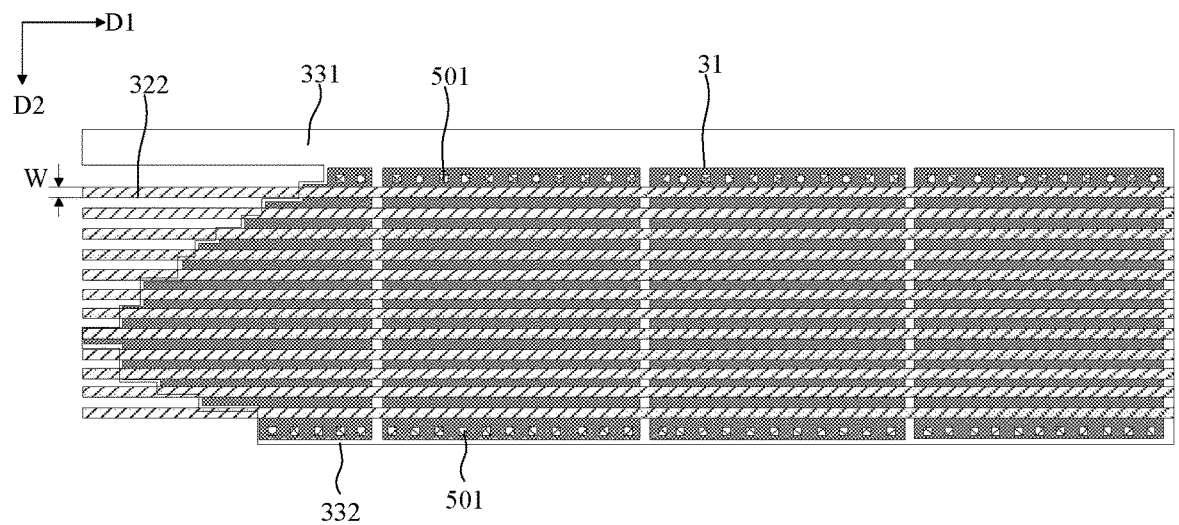
FIG. 7 is a schematic partial enlarged view of a region Q in FIG. 2.

FIG. 6 is a schematic sectional view taken along a P-P direction in FIG. 2. A film layer structure of the capacitance compensation region B1 is illustrated by taking only five second gate lines 322 as an example. FIG. 7 is a schematic partial enlarged view of a region Q in FIG. 2. In at least one exemplary embodiment, as shown in FIGS. 2, 6, and 7, a first capacitance compensation unit 221 is provided in the capacitance compensation region B1. The first capacitance compensation unit 221 may include a semiconductor structure 31, a first metal structure 32, and a second metal structure 33 which are disposed on the base substrate 10 sequentially. The semiconductor structure 31 and the first metal structure 32 are insulated from each other, and the first metal structure 32 and the second metal structure 33 are insulated from each other. As shown in FIG. 2, a structure of the first capacitance compensation unit 221 on a side close to the first display region A1 and a structure of the first capacitance compensation unit 221 on a side close to the second display region A2 may be mirror images along a center line of the display substrate in the first direction D1. The structure of the first capacitance compensation unit 221 on the side close to the first display region A1 is taken as an example for illustration and description below with reference to the drawings.

Figure 8A:
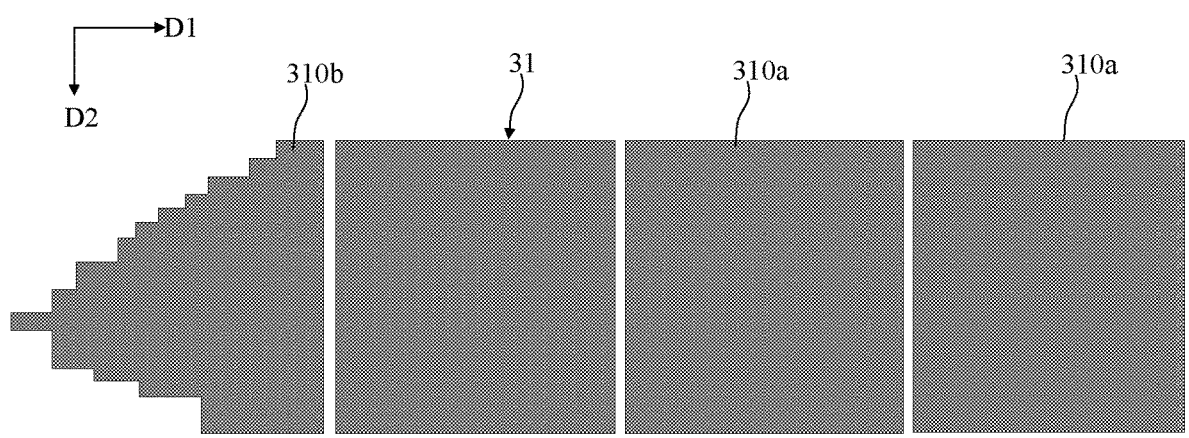
FIG. 8A is a top view of a semiconductor structure in FIG. 7.

FIG. 8A is a top view of the semiconductor structure in FIG. 7. As shown in FIGS. 6, 7, and 8A, the semiconductor structure 31 may include a plurality of semiconductor blocks 310a and 310b regularly arranged. Semiconductor blocks 310a are rectangular semiconductor blocks. Semiconductor blocks 310b are arranged at both ends of a plurality of semiconductor blocks 310a along the first direction D1. Sizes of the plurality of semiconductor blocks 310a may be the same or may decrease from middle to edges of both sides along the first direction D1. Lengths of semiconductor blocks 310b located at edge positions in the first direction D1 may first increase and then decrease. However, this embodiment is not limited thereto. In some examples, the semiconductor structure may include a plurality of rows of semiconductor blocks. Trapezoidal or triangular semiconductor blocks may be arranged at edge positions of each row, and rectangular semiconductor blocks may be arranged in a middle region. Taking the trapezoidal semiconductor blocks arranged at edge positions of each row as an example, long sides of the trapezoidal semiconductor blocks are adjacent to the rectangular semiconductor blocks.

In at least one exemplary embodiment, as shown in FIGS. 6 and 7, the first metal structure 32 may include a plurality of second gate lines 322 extending along the first direction D1. Widths W of the plurality of second gate lines 322 may be different. An orthographic projection of any one of the second gate lines 322 on the base substrate is partially overlapped with an orthographic projection of a semiconductor block of the semiconductor structure on the base substrate. However, this embodiment is not limited thereto. For example, the widths of the plurality of second gate lines may be the same.

Figure 8B:
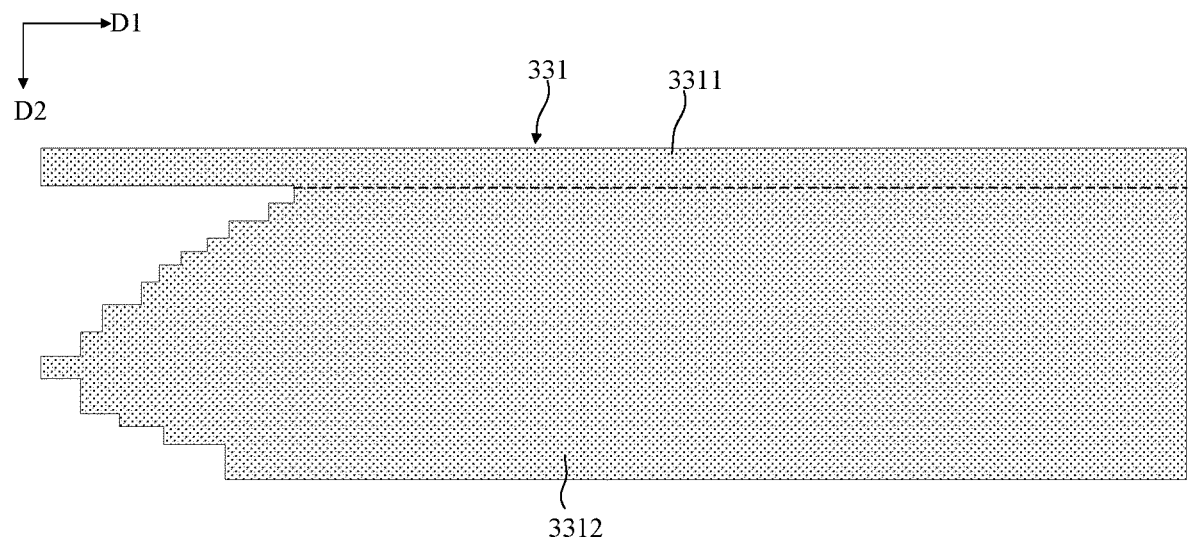
FIG. 8B is a top view of a second metal structure of FIG. 7.

FIG. 8B is a top view of the second metal structure in FIG. 7. As shown in FIGS. 6, 7, and 8B, the second metal structure 33 may include a first potential signal line 331. For example, the first potential signal line 331 may be a low potential power line (VSS). The first potential signal line 331 may include a main body portion 3311 and an extension portion 3312. The main body portion 3311 extends along the first direction D1, the extension portion 3312 extends along the second direction D2, and one end of the extension portion 3312 close to the notch region is connected with the main body portion 3311. A length of the extension portion 3312 in the first direction D1 gradually increases and then decreases along a direction away from the notch region. However, this embodiment is not limited thereto. For example, the length of the extension portion in the first direction may increase, or decrease first and then increase, or decrease along the direction away from the notch region.

In at least one exemplary embodiment, as shown in FIGS. 6 and 7, a plurality of first vias 501 may be provided in insulation layers (including a first insulation layer 13, a second insulation layer 16, and a third insulation layer 18, as shown in FIG. 6) between the semiconductor structure 31 and the second metal structure 33, and electrical connections between the first potential signal line 331 of the second metal structure 33 and the semiconductor blocks 310a and 310b of the semiconductor structure 31 may be achieved respectively through the plurality of first vias 501. As shown in FIGS. 6, 7, 8A, and 8B, in the first capacitance compensation unit 221, an orthographic projection of the first potential signal line 331 of the second metal structure 33 on the base substrate 10 may cover an orthographic projection of the semiconductor structure 31 on the base substrate 10. As shown in FIGS. 6 and 7, the orthographic projection of the first potential signal line 331 of the second metal structure 33 on the base substrate 10 may be partially overlapped with orthographic projections of a plurality of second gate lines 322 on the base substrate 10. An orthographic projection of at least one of the second gate lines 322 on the base substrate 10 may be partially overlapped with the orthographic projection of the semiconductor structure 31 on the base substrate 10. As shown in FIG. 7, the plurality of first vias 501 may be arranged regularly along the first direction D1 to form two opposite rows of first vias 501.

In this exemplary embodiment, in the first capacitance compensation unit 221, a second gate line 322 of the first metal structure 32 may form a three-layer capacitance structure together with the semiconductor structure 31 and the first potential signal line 331 of the second metal structure 33, serving as a compensation capacitor of a first gate line in the display region connected with the second gate line 322, to increase loading capacitances of first gate lines in the first sub-display region and the second sub-display region. The first potential signal line 331 and the semiconductor structure 31 are electrically connected with each other and may jointly serve as a first electrode of the compensation capacitor, and the second gate line 322 may serve as a second electrode of the compensation capacitor. A size of the compensation capacitor may be calculated and designed through theoretical simulation. In some examples, after the size of the compensation capacitor is designed according to theoretical simulation, shapes of the first potential signal line and the semiconductor structure are substantially fixed, so that the size of the compensation capacitor may be adjusted by adjusting a size of the second gate line, for example, the size of the compensation capacitor may be adjusted by adjusting a width of the second gate line. In some examples, widths of a plurality of second gate lines may be different in the capacitance compensation region B1, thereby providing compensation capacitors of different sizes to a first gate line connected with a second gate line to achieve an effect of targeted compensation for a loading capacitance of the first gate line. A width of the second gate line and a width of the first gate line connected thereto may be the same or different. However, this embodiment is not limited thereto.

In at least one exemplary embodiment, as shown in FIG. 6, the third sub-display region A3 may include the base substrate 10, and the semiconductor layer, the first conductive layer, the second conductive layer, and the third conductive layer that are disposed on the base substrate 10 sequentially. The semiconductor layer may include an active layer 12 of a transistor. The first conductive layer may include a gate electrode 14 of the transistor, a first electrode 15 of a storage capacitor, and a first gate line (not shown) connected with the gate electrode. The second conductive layer may include a second electrode 17 of the storage capacitor. The third conductive layer may include a source electrode 20 and a drain electrode 19 of the transistor. A buffer layer 11 may be disposed on one side of the active layer 12 close to the base substrate 10. A first insulation layer 13 may be disposed between the active layer 12 and the first conductive layer. A second insulation layer 16 may be disposed between the first conductive layer and the second conductive layer. A third insulation layer 18 may be disposed between the second conductive layer and the third conductive layer. A fourth insulation layer, a fourth conductive layer (for example, including an anode of a light emitting element), a pixel definition layer, an organic light emitting layer, a cathode layer, and an encapsulating layer may be formed sequentially on one side of the third conductive layer away from the base substrate 10, thereby forming a sub-pixel. Structures of the first sub-display region and the second sub-display region are the same as a structure of the third sub-display region, and thus will not be repeated herein.

In at least one exemplary embodiment, as shown in FIG. 6, the semiconductor structure 31 of the capacitance compensation region B1 may be disposed on a same layer as the semiconductor layer of the third sub-display region A3, the first metal structure 32 of the capacitance compensation region B1 may be disposed on a same layer as the second conductive layer of the third sub-display region A3, and the second metal structure 33 of the capacitance compensation region B1 may be disposed on a same layer as the third conductive layer of the third sub-display region A3. The first insulation layer 13, the second insulation layer 16, and the third insulation layer 18 may be disposed between the second metal structure 33 and the semiconductor structure 31. However, this embodiment is not limited thereto. In some examples, the fourth conductive layer may include a connection electrode for connecting the drain electrode of the transistor with the anode of the light emitting element. A fourth insulation layer may be disposed between the third conductive layer and the fourth conductive layer. A fifth insulation layer, a fifth conductive layer (for example, including the anode of the light emitting element), a pixel definition layer, an organic light emitting layer, a cathode layer, and an encapsulating layer may be formed sequentially on one side of the fourth conductive layer away from the base substrate, thereby forming a sub-pixel. In this example, the first metal structure of the capacitance compensation region may be disposed on a same layer as the third conductive layer of the display region, and the second metal structure of the capacitance compensation region may be disposed on a same layer as the fourth conductive layer of the display region.

In at least one exemplary embodiment, as shown in FIG. 7, the plurality of second gate lines 322 forming the first capacitance compensation unit 221 may extend in parallel along the first direction D1. The plurality of first vias 501 may be arranged along an extension direction (i.e., the first direction D1) of the second gate lines 322. A distance between two adjacent first vias 501 may be at least greater than a sum of widths of two second gate lines 322 in the second direction D2 perpendicular to the first direction D1. For example, N second gate lines are provided in the capacitance compensation region, then the distance between two adjacent first vias 501 in the second direction D2 may be greater than a sum of widths of the N second gate lines, that is, a plurality of first vias are provided at edge positions on both opposite side of the N second gate lines along the second direction to achieve an electrical connection between the semiconductor structure and the second metal structure. However, this embodiment is not limited thereto. For example, N second gate lines are provided in the capacitance compensation region, then the distance between two adjacent first vias may be less than a sum of widths of the N second gate lines and is greater than a sum of widths of N/2 second gate lines in the second direction, and N may be an integer greater than 4, that is, the N second gate lines are divided into two groups, and a plurality of first vias are provided at junctions of the two groups of second gate lines along the second direction and at outer edge positions, so as to achieve an electrical connection between the semiconductor structure and the second metal structure. In this exemplary embodiment, adjacent second gate lines between two rows of first vias may be compactly arranged, thereby reducing a pitch between the adjacent second gate lines, thereby saving an occupied border region and facilitating achievement of a design of a narrow border.

In at least one exemplary embodiment, as shown in FIGS. 7 and 8A, taking semiconductor blocks included in the semiconductor structure being rectangular semiconductor blocks as an example, the plurality of first vias 501 may be respectively arranged at edges of both opposite sides of rectangular semiconductor blocks 310a in the second direction D2 (e.g., at upper edge and lower edge positions in the second direction D2). Since an orthographic projection of a rectangular semiconductor block 310a on the base substrate may be overlapped with a plurality of second gate lines 322, a distance between adjacent first vias 501 may be greater than a sum of widths of the plurality of second gate lines 322 in the second direction D2. In this example, the first vias 501 may be square vias. However, this embodiment is not limited thereto. For example, the first vias 501 may be in a shape of a circle, a long strip, or the like.

In at least one exemplary embodiment, as shown in FIGS. 7 and 8A, the plurality of first vias 501 may be provided at an edge of one side of at least one rectangular semiconductor block 310a in the second direction D2, and two rows of first vias 501 regularly arranged may be formed at edges of both opposite sides of the rectangular semiconductor block 310a. In some examples, in the first direction D1, a pitch between two adjacent first vias 501 may be greater than or equal to 1 micron (μm). However, this embodiment is not limited thereto. In some examples, the plurality of first vias may be arranged only at an edge of one side of the rectangular semiconductor block 310a in the second direction D2, for example, at upper edge or lower edge positions in the second direction. On a semiconductor block 310b at an edge position of the semiconductor structure in the first direction, a plurality of first vias 501 may be arranged at relatively farthest edge positions of the semiconductor block 310b along the second direction D2.

A technical solution of this embodiment will be described below through an example of a preparation process of the display substrate of this embodiment. A "patterning process" mentioned in this embodiment includes processes such as deposition of a film layer, photoresist coating, mask exposure, development, etching, and photoresist stripping, and is a known and mature preparation process. Deposition may be implemented using a known process, such as sputtering, evaporation, and chemical vapor deposition, coating may be implemented using a known coating process, and etching may be implemented using a known method, which is not limited herein. In description of this embodiment, a "thin film" refers to a layer of thin film formed by a material on a base substrate using deposition or another process.

In some exemplary implementation modes, the preparation process of the display substrate according to this exemplary embodiment may include acts (1) to (6).

In act (1), a semiconductor layer is formed in a display region and a semiconductor structure is formed in a capacitance compensation region. In some exemplary implementation modes, a buffer layer 11 is formed on a base substrate 10, a semiconductor thin film is deposited on the buffer layer 11, and the semiconductor thin film is patterned through a patterning processes to form a semiconductor layer in a display region A and form a semiconductor structure 31 in a capacitance compensation region B1. In some examples, the semiconductor structure is disposed on a same layer as the semiconductor layer. As shown in FIGS. 6, 7, and 8A, the semiconductor layer may include the active layer 12 of the transistor, and the semiconductor structure may include the plurality of semiconductor blocks 310a and 310b arranged regularly. A size of each semiconductor block 310a or 310b may be greater than a size of an active layer of any one of transistors in the display region. In some examples, the semiconductor blocks may be rectangular. For example, a length of a semiconductor block in the capacitance compensation region B1 along the first direction D1 may range from 10 microns to 300 microns, for example, may be 260 microns. However, this embodiment is not limited thereto.

Among them, the base substrate 10 may be a flexible base substrate and made of a material such as polyimide (PI), polyethylene terephthalate (PET), or a surface-treated polymer soft film.

The semiconductor thin film may be made of one or more materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene, that is, this embodiment is applicable to a display substrate based on a top gate Thin Film Transistor (TFT) and manufactured based on an oxide technology, a silicon technology, and an organic matter technology.

In act (2), on the base substrate on which the aforementioned structures are formed, a first conductive layer is formed in the display region. In some exemplary implementation modes, on the base substrate 10 on which the aforementioned structures are formed, a first insulation thin film and a first conductive thin film are deposited sequentially, and the first conductive thin film is patterned through a patterning processes to form a first insulation layer 13 covering the semiconductor layer and the semiconductor layer and form a first conductive layer on the first insulation layer 13 in the display region A. The first conductive layer may include the first gate lines, the gate electrode 14 of the transistor, and the first electrode 15 of the storage capacitor, as shown in FIG. 6.

In act (3), on the base substrate on which the aforementioned structures are formed, a second conductive layer is formed in the display region and a first metal structure is formed in the capacitance compensation region. In some examples, the second conductive layer may be disposed on a same layer as the first metal structure. In some exemplary implementation modes, on the base substrate 10 on which the aforementioned structures are formed, a second insulation thin film and a second conductive thin film are deposited, and the second conductive thin film is patterned through a patterning processes to form a second insulation layer 16 covering the first conductive layer, form a second conductive layer on the second insulation layer 16 in the display region A, and form a first metal structure 32 on the second insulation layer 16 in the capacitance compensation region B1, as shown in FIG. 6. The second conductive layer in the display region A may include the second electrode 17 of the storage capacitor; the first metal structure 32 in the capacitance compensation region B1 may include the plurality of second gate lines 322. A first gate line in the display region A may be connected with the gate electrode of the transistor. A position of the second electrode 17 of the storage capacitor corresponds to the first electrode 15.

In some exemplary implementation modes, a second gate line 322 of the first metal structure 32 may be connected with a first gate line of the first conductive layer through a via provided on the second insulation layer 16 to achieve connecting first gate lines in the first sub-display region and the second sub-display region through a second gate line. In some examples, gate line connection electrodes may be provided at a junction of the first sub-display region and the capacitance compensation region and at a junction of the second sub-display region and the capacitance compensation region, the gate line connection electrodes are arranged on a same layer as a second gate line and connected with the second gate line, and are respectively connected with a first gate line in the first sub-display region and a first gate line in the second sub-display region through vias provided on the second insulation layer. Or, a second gate line in the capacitance compensation region may extend to the junction of the first sub-display region and the capacitance compensation region and the junction of the second sub-display region and the capacitance compensation region, the second gate line is respectively connected with the first gate line in the first sub-display region and the first gate line in the second sub-display region through the vias provided on the second insulation layer. However, this embodiment is not limited thereto.

In act (4), on the base substrate on which the aforementioned structures are formed, a third conductive layer is formed in the display region, and the second metal structure is formed in the capacitance compensation region. In some examples, the third conductive layer may be disposed on a same layer as the second metal structure. In some exemplary implementation modes, on the base substrate 10 on which the aforementioned structures are formed, a third insulation thin film is deposited, and the third insulation thin film is patterned through a patterning processes to form a third insulation layer 18. A plurality of vias are provided on the third insulation layer 18 in the display region A to expose respectively both ends of the active layer. A plurality of first vias 501 are provided on the third insulation layer 18 in the capacitance compensation region B1 to expose respectively edges of both opposite sides of the semiconductor structure 31 in the second direction D2. Then, a third conductive thin film is deposited, and the third conductive thin film is patterned through a patterning processes to form a third conductive layer in the display region A and form a second metal structure 33 in the capacitance compensation region B1. The third conductive layer may include patterns of the source electrode 20 and the drain electrode 19 of the transistor, a power line (not shown), and a data signal line (not shown) as shown in FIG. 6. In some examples, the second metal structure 33 may include a first potential signal line 331 such as a low potential power line, as shown in FIG. 6. The source electrode 20 and the drain electrode 19 are connected with both ends of the active layer 12 respectively. The first potential signal line 331 may be connected with the semiconductor structure 31 through the first vias 501.

In act (5), on the base substrate 10 on which the aforementioned structures are formed, a fourth insulation layer is formed. The fourth insulation layer may be made of an organic material such as a polysiloxane-based material, an acrylic-based material, or a polyimide-based material. The fourth insulation layer may be referred to as a planarization layer. In some examples, the fourth insulation layer may include a stacked structure made of an inorganic material and an organic material.

In act (6), on the base substrate on which the aforementioned structures are formed, a light emitting element is formed in the display region. In some exemplary implementation modes, on the base substrate 10 on which the aforementioned structures are formed, an anode is formed in the display region A, and the anode may be connected with a drain of the transistor through a via on the fourth insulation layer. Then, a pixel definition thin film is coated, and a pattern of the pixel definition layer is formed through mask exposure and development, and an opening region exposing the anode is defined. Then, an organic light emitting layer is formed in the opening region by means of evaporation or inkjet printing, and a cathode covering the organic light emitting layer is formed by means of evaporation. Then, an encapsulation layer of an inorganic/organic/inorganic three-layer structure may be formed to complete encapsulation of the display substrate.

The pixel definition thin film may be made of an organic material such as polyimide, acrylic, or polyethylene terephthalate.

In some examples, the organic light emitting layer mainly may include a light emitting material layer. In some examples, the organic light emitting layer may include a hole injection layer, a hole transport layer, a light emitting material layer, an electron transport layer, and an electron injection layer arranged sequentially, and may improve an efficiency of injection of electrons and holes into the light emitting layer. However, this embodiment is not limited thereto.

In some examples, the buffer layer 11, the first insulation layer 13, the second insulation layer 16, and the third insulation layer 18 may be made of Silicon Oxide (SiOx), Silicon Nitride (SiNx), Silicon Oxynitride (SiON), etc., or may be made of a high dielectric constant (high k) material such as Aluminum Oxide (AlOx), hafnium oxide (HfOx), Tantalum Oxide (TaOx), and may be a single layer, a multi-layer, or a composite layer. Generally, the first insulation layer 13 and the second insulation layer 16 may be referred to as gate insulators, and the third insulation layer 18 may be referred to as an interlayer dielectric layer.

In some examples, the first conductive thin film to the fourth conductive thin film may all be made of a metal material, such as silver (Ag), copper (Cu), aluminum (Al), and molybdenum (Mo), or an alloy material of the above metals, such as an Aluminum Neodymium (AlNd) alloy, a Molybdenum Niobium (MoNb) alloy, and may be of a multi-layer stacked structure, such as Mo/Cu/Mo and Mo/Al/Mo, or may be of a stacked structure formed of metal and transparent conductive materials, such as ITO/Ag/ITO.

In some examples, the anode may be made of at least one transparent conductive material of Indium Tin Oxide (ITO), Indium Zinc Oxide (IZO), Zinc Oxide (ZnO), Indium Gallium Oxide (IGO), and Aluminum Zinc Oxide (AZO). The cathode may be made of silver (Ag), magnesium (Mg), aluminum (Al), platinum (Pt), palladium (Pd), gold (Au), nickel (Ni), neodymium (Nd), iridium (Ir), chromium (Cr), or a compound thereof. However, this embodiment is not limited thereto.

In the display substrate according to this exemplary embodiment, loading capacitances of first gate lines in the first sub-display region and the second sub-display region may be increased through the first capacitance compensation unit provided in the capacitance compensation region, thereby improving display uniformity of the display region. Moreover, space occupied by the first capacitance compensation unit may be reduced by providing a first via at an edge position of the semiconductor structure in the second direction, thus it is beneficial to reduce a size of a border. Moreover, in this exemplary embodiment, since a first potential signal line is provided in an original border region, there is no need to add an additional structure to compensate a loading capacitance of a first gate line in the display region, thereby it is convenient to reduce a border of the display substrate, which is beneficial to a design of a narrow border.

Figure 9:
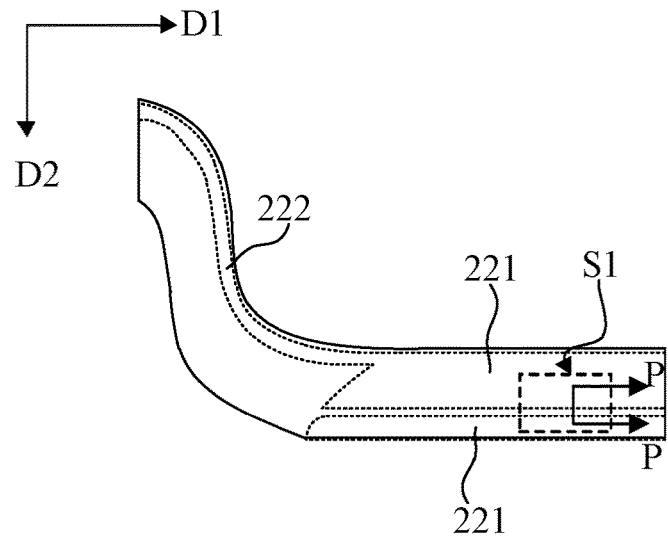
FIG. 9 is a schematic diagram of a structure of a capacitance compensation region according to at least one embodiment of the present disclosure.
Figure 10:
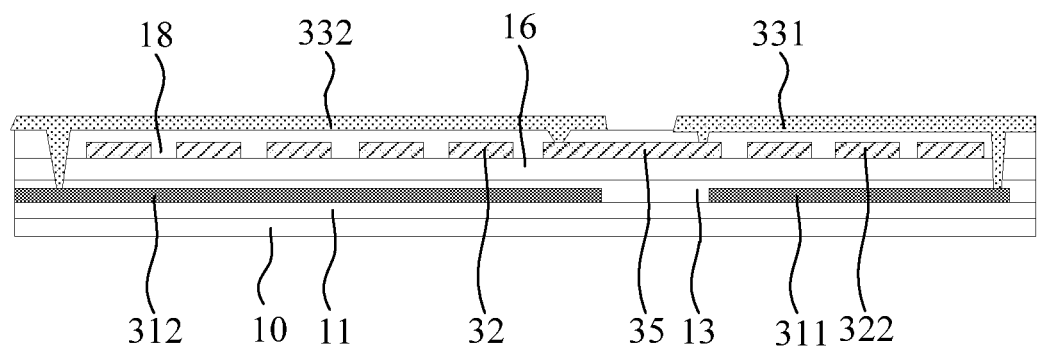
FIG. 10 is a schematic sectional view taken along a P-P direction in FIG. 9.
Figure 11:
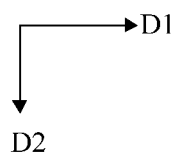
FIG. 11 is a schematic partial enlarged view of a region S1 in FIG. 9.
Figure 11:
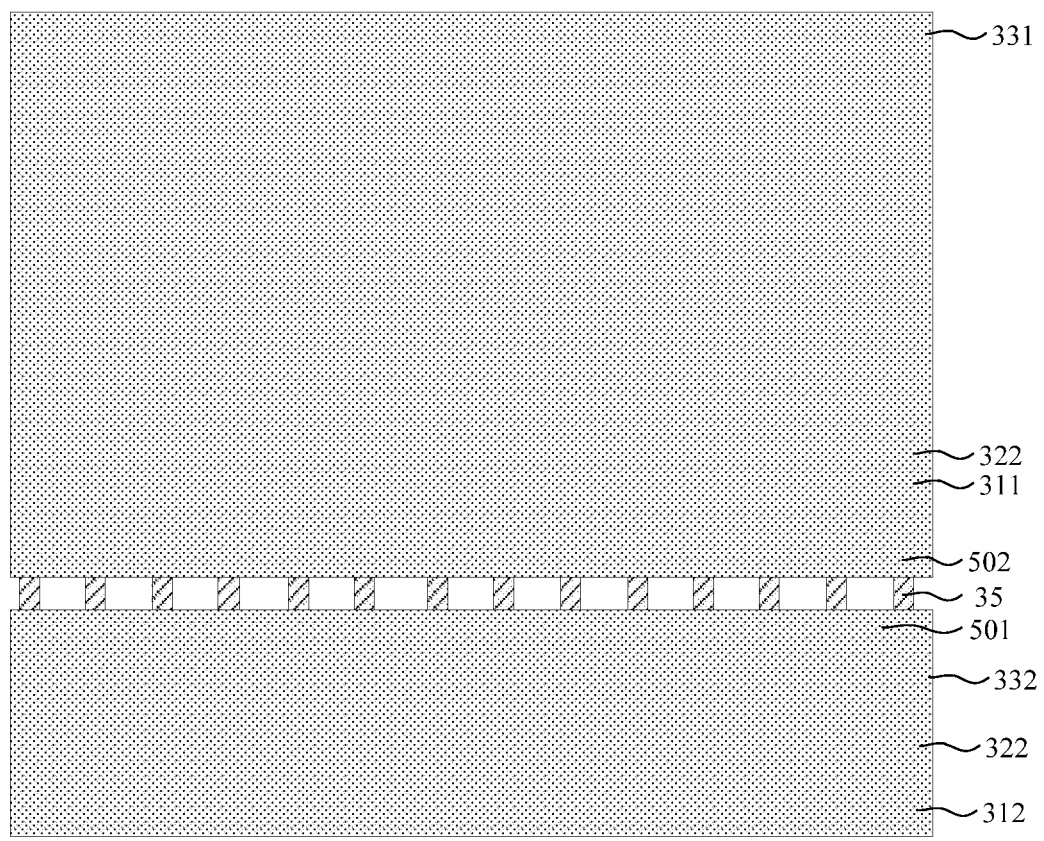
Figure 12A:
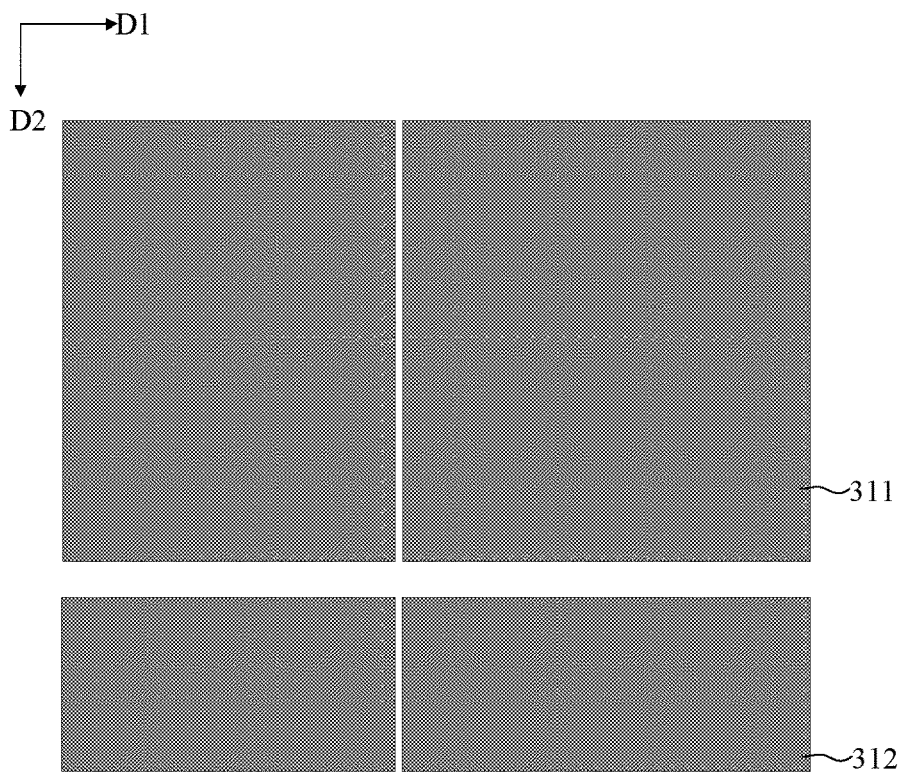
FIG. 12A is a top view of a semiconductor structure in FIG. 11.
Figure 12B:
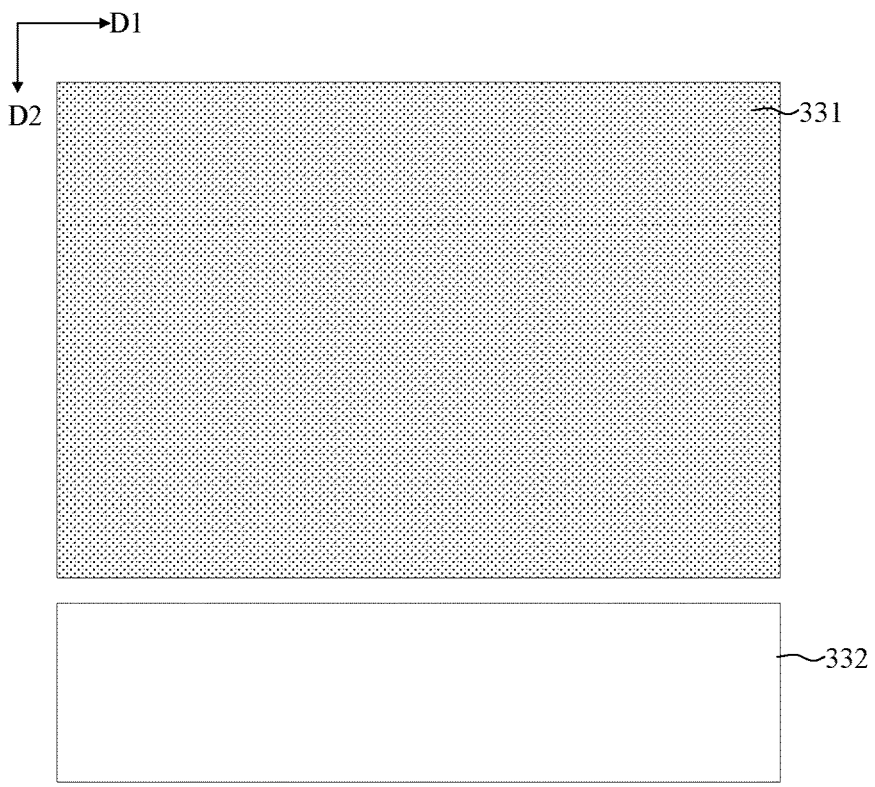
FIG. 12B is a top view of a second metal structure in FIG. 11.

FIG. 9 is a schematic diagram of a structure of a capacitance compensation region according to at least one embodiment of the present disclosure, which is a schematic partial enlarged view of a region S in FIG. 1. FIG. 10 is a schematic sectional view taken along a P-P direction in FIG. 9. FIG. 11 is a schematic partial enlarged view of a region S1 in FIG. 9. FIG. 12A is a top view of a semiconductor structure in FIG. 11. FIG. 12B is a top view of a second metal structure in FIG. 11.

In at least one exemplary embodiment, as shown in FIGS. 9 and 10, a first capacitance compensation unit 221 and a second capacitance compensation unit 222 are provided in the capacitance compensation region B1. The first capacitance compensation unit 221 may include a semiconductor structure, a first metal structure, and a second metal structure that are disposed on the base substrate 10 sequentially. The semiconductor structure includes a plurality of semiconductor blocks 311 and 312. The first metal structure includes a plurality of second gate lines 322. The second metal structure includes a first potential signal line 331 and an extension electrode 332. In this example, the first potential signal line 331 is a low potential power line. The second capacitance compensation unit 222 may include a third metal structure and a fourth metal structure that are disposed on the base substrate 10 sequentially and insulated from each other. The third metal structure includes a plurality of second gate lines, and the fourth metal structure includes a first potential signal line. The third metal structure and the first metal structure are structures on a same layer, and the fourth metal structure and the second metal structure are structures on a same layer. In the second capacitance compensation unit 222, the third metal structure and the fourth metal structure may form a capacitor. The second gate lines included in the third metal structure are continuous with the second gate lines included in the first metal structure, and the first potential signal line included in the fourth metal structure is continuous with the first potential signal line included in the second metal structure. In the capacitance compensation region, the second capacitance compensation unit 222 may be located on one side of the first capacitance compensation unit 221 close to the first sub-display region or on one side of the first capacitance compensation unit 221 close to the second sub-display region. However, this embodiment is not limited thereto.

In at least one exemplary embodiment, as shown in FIGS. 1 and 9, in the capacitance compensation region, second gate lines close to the notch region may increase loading capacitances of first gate lines in the first sub-display region and the second sub-display region through the second capacitance compensation unit 222 and the first capacitance compensation unit 221; second gate lines away from the display region may increase the loading capacitances of the first gate lines in the first sub-display region and the second sub-display region through the first capacitance compensation unit 221 only.

In at least one exemplary embodiment, as shown in FIGS. 9 and 10, the extension electrode 332 may be provided on one side of the first potential signal line 331 close to the third sub-display region (i.e., one side away from the notch region), and an electrical connection between the extension electrode 332 and the first potential signal line 331 may be achieved through a plurality of connection electrodes 35. For example, the plurality of connection electrodes 35 may be arranged on a same layer as the second gate lines 322. The extension electrode 332 and the first potential signal line 331 are respectively connected with the connection electrodes 35 through second vias provided on the third insulation layer 18. However, this embodiment is not limited thereto. In some examples, the plurality of connection electrodes 35 may be disposed on a same layer as first gate lines in the display region and the gate electrode of the transistor.

In order to effectively prevent water and oxygen from entering the display region, an isolation groove or an isolation dam around the display region is formed in the border region during the preparation process of the display substrate. In order to avoid formation of a water and oxygen channel, a continuous second metal structure will not be formed at a position of the isolation groove or the isolation dam. As shown in FIGS. 11 and 12B, in this exemplary embodiment, by providing the extension electrode 332 which is not continuous with the first potential signal line 331 and by achieving the electronic connection between the extension electrode 332 and the first potential signal line 331 through the connection electrodes 35 arranged on the same layer as the first metal structure, not only a coverage of the first capacitance compensation unit may be expanded, but also an influence of the isolation groove or the isolation dam on the capacitance compensation unit may be avoided.

In at least one exemplary embodiment, as shown in FIGS. 1, 2, and 9, in the capacitance compensation region B1, the plurality of second gate lines 322 may respectively include two curve segments and one straight line segment. Both ends of a straight line segment of one of the second gate lines 322 are respectively connected with one curve segment, one of the curve segments may be connected with a first gate line 321 in the first sub-display region A1, and the other of the curve segments may be connected with a first gate line 321 in the second sub-display region A2. That is, second gate lines 322 in the capacitance compensation region B1 may extend along an outer contour of the display region A. However, this embodiment is not limited thereto.

In at least one exemplary implementation mode, a width of the first potential signal line 331 may be greater than a width of a second gate line 322. An orthographic projection of a curve segment of a second gate line 322 close to the notch region on the base substrate may be covered by an orthographic projection of the first potential signal line 331 on the base substrate such that the second gate line is overlapped with the first potential signal line to form a capacitor, which is used as the second capacitance compensation unit to increase a loading capacitance on a first gate line.

In at least one exemplary embodiment, as shown in FIG. 9, the first potential signal line forming the first capacitance compensation unit 221 may have a main body portion extending along the first direction D1 and an extension portion extending along the second direction D2, one end of the extension portion close to the notch region is connected with the main body portion, and a length of the extension portion in the first direction D1 may gradually increase along a direction away from the notch region. A length of the extension electrode forming the first capacitance compensation unit 221 in the first direction D1 may gradually increase along the direction away from the notch region. In this example, as shown in FIG. 12A, the semiconductor structure may include a plurality of regularly arranged semiconductor blocks 311 corresponding to the first potential signal line and a plurality of regularly arranged semiconductor blocks 312 corresponding to the extension electrode. In some examples, sizes of the semiconductor blocks 311 and 312 may be the same or different. For example, a length of a semiconductor block 311 along the second direction D2 may be greater than a length of a semiconductor block 312 along the second direction D2. However, this embodiment is not limited thereto.

In this exemplary implementation mode, as shown in FIG. 9, since there are variations in lengths of the first potential signal line 331 and the extension electrode 332 in the first direction D1, overlapping areas of the first potential signal line 331 and the extension electrode 332 with different second gate lines are different, and compensation capacitors of different sizes may be provided for different second gate lines, thereby achieving an effect of targeted compensation for a loading capacitance of a gate line. In some examples, a size of a compensation capacitor may also be adjusted by adjusting a shape of the semiconductor structure to achieve an effect of targeted compensation.

In at least one exemplary embodiment, as shown in FIGS. 9 and 11, both the first vias 501 and second vias 502 are located at edge positions of one side of the first potential signal line 331 away from the notch region and edge positions of one side of the first extension electrode 332 close to the notch region. The first vias 501 may be spaced apart from the second vias 502 and extend along the first direction D1. A pitch between the first potential signal line 331 and the extension electrode 332 is greater than 10 microns in the second direction D2, thus, as shown in FIG. 11, a distance between two rows of first vias 501 arranged along the first direction D1, along the second direction D2, is at least greater than a width of two second gate lines. The first vias 501 may also be located at edge positions of one side of the first potential signal line 331 close to the notch region and edge positions of one side of the extension electrode 332 away from the notch region. However, this embodiment is not limited thereto. In some examples, the second vias 502 may be provided at the edge positions of one side of the first potential signal line 331 away from the notch region and the edge positions of one side of the extension electrode 332 close to the notch region; the first vias 501 may be provided at positions of one side of the first potential signal line 331 close to the notch region and the edge positions of one side of the extension electrode 332 away from the notch region.

Figure 13:
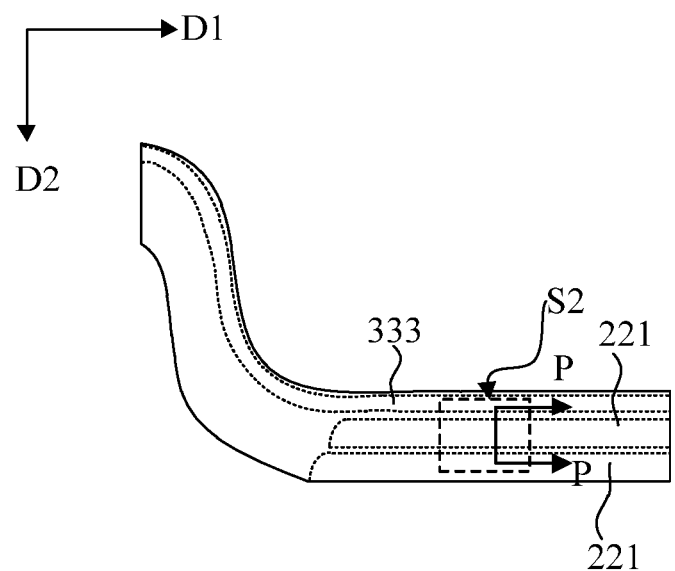
FIG. 13 is a schematic diagram of another structure of the capacitance compensation region according to at least one embodiment of the present disclosure.
Figure 14:
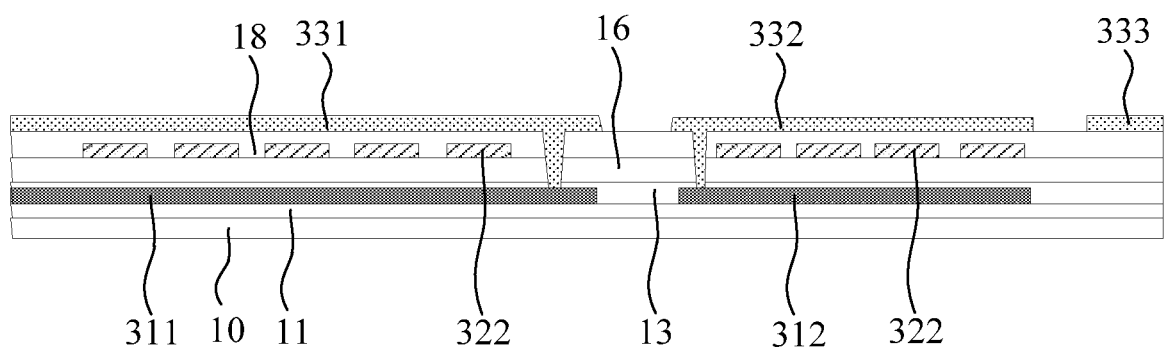
FIG. 14 is a schematic sectional view taken along a P-P direction in FIG. 13.
Figure 15:
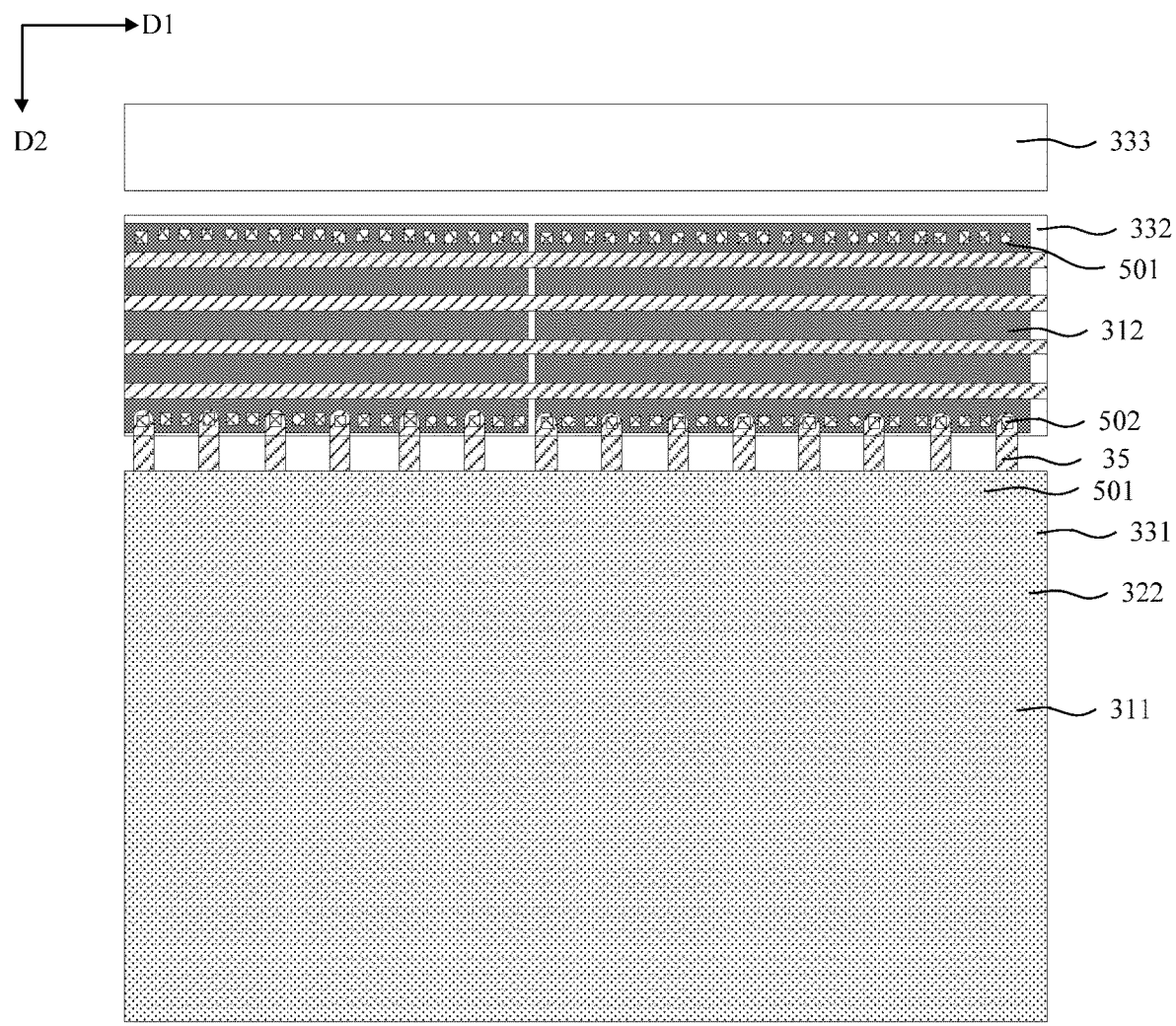
FIG. 15 is a schematic partial enlarged view of a region S2 in FIG. 13.
Figure 16A:
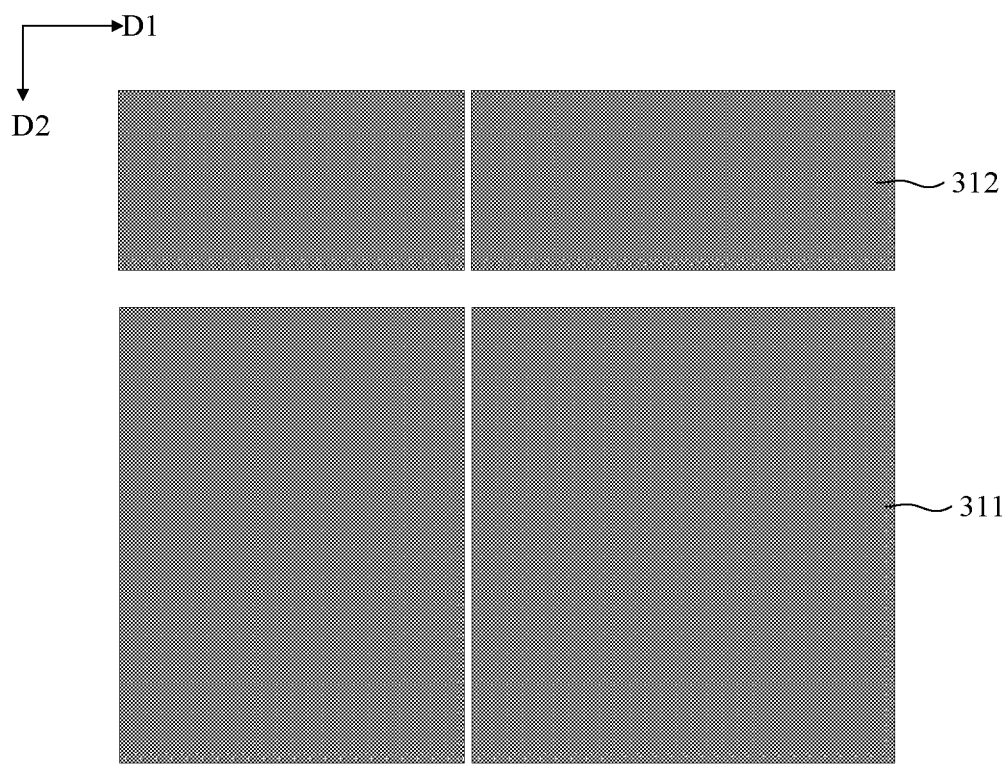
FIG. 16A is a top view of a semiconductor structure in FIG. 15.
Figure 16B:
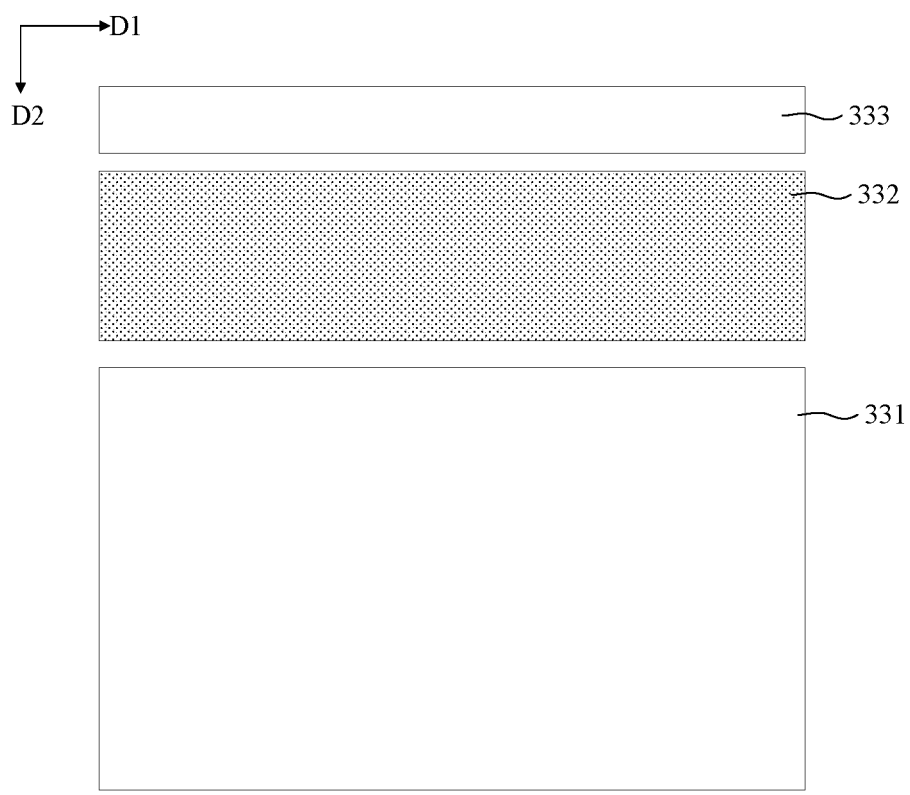
FIG. 16B is a top view of a second metal structure in FIG. 15.

FIG. 13 is a schematic diagram of another structure of the capacitance compensation region according to at least one embodiment of the present disclosure, and is a schematic partial enlarged view of a region S in FIG. 1. FIG. 14 is a schematic sectional view taken along a P-P direction in FIG. 13. FIG. 15 is a schematic partial enlarged view of a region S2 in FIG. 13. FIG. 16A is a top view of a semiconductor structure in FIG. 15. FIG. 16B is a top view of a second metal structure in FIG. 15.

In at least one exemplary embodiment, as shown in FIGS. 1, 13, and 14, a first capacitance compensation unit 221 is provided in the capacitance compensation region B1. The first capacitance compensation unit 221 may include a semiconductor structure 31, a first metal structure, and a second metal structure that are sequentially disposed on the base substrate 10. The semiconductor structure includes a plurality of semiconductor blocks 311 and 312. The first metal structure includes a plurality of second gate lines 322. The second metal structure includes a first potential signal line 331 and an extension electrode 332. In this example, the first potential signal line 331 is a high potential power line (VDD). A second potential signal line 333 is provided on one side of the extension electrode 332 close to the notch region. The second potential signal line 333 is a low potential power line (VSS). In this exemplary embodiment, in the first capacitance compensation unit 221, a second gate line, the semiconductor structure, and the first potential signal line may form a capacitor, and a second gate line, the semiconductor structure, and the extension electrode may form a capacitor.

In at least one exemplary embodiment, as shown in FIGS. 13 and 15, the first potential signal line 331 may extend from the third sub-display region to the capacitance compensation region, the extension electrode 332 is not continuous with the first potential signal line 331, and an electrical connection may be achieved through a plurality of connection electrodes 35. The connection electrodes 35 may be arranged on a same layer as the second gate lines 322. The extension electrode 332 and the first potential signal line 331 are respectively connected with the connection electrodes 35 through third vias provided on the third insulation layer 18. In this exemplary embodiment, as shown in FIGS. 15 and 16B, by providing the extension electrode 332 which is not continuous with the first potential signal line 331 and by achieving the electronic connection between the extension electrode 332 and the first potential signal line 331 through the connection electrodes 35 arranged on a same layer as the first metal structure, not only a coverage of the first capacitance compensation unit may be expanded, but also an influence of an isolation groove or an isolation dam on the capacitance compensation unit may be avoided.

In at least one exemplary embodiment, as shown in FIG. 13, a length of the first potential signal line 331 forming the first capacitance compensation unit 221 in the first direction D1 may gradually decrease along a direction close to the notch region. However, this embodiment is not limited thereto. In some examples, a length of the first potential signal line in the first direction may gradually increase and then decrease along the direction close to the notch region. As shown in FIG. 13, a length of the extension electrode forming the first capacitance compensation unit 221 in the first direction D1 may gradually decrease in the direction close to the notch region. In this example, as shown in FIG. 16A, the semiconductor structure may include a plurality of regularly arranged semiconductor blocks 311 corresponding to the first potential signal line and a plurality of regularly arranged semiconductor blocks 312 corresponding to the extension electrode. In some examples, sizes of semiconductor blocks 311 and 312 may be the same or different. For example, a length of a semiconductor block 311 along the second direction D2 may be greater than a length of the semiconductor block 312 along the second direction D2. However, this embodiment is not limited thereto.

In at least one exemplary embodiment, as shown in FIG. 15, both first vias 501 and second vias 502 may be located at edge positions of one side of the first potential signal line 331 close to the notch region and edge positions of one side of the extension electrode 332 away from the notch region. The first vias 501 may be spaced apart from the second vias 502 and extend along the first direction D1. A pitch between the first potential signal line 331 and the extension electrode 332 is greater than 10 microns in the second direction D2, thus, as shown in FIG. 15, a distance between two rows of first vias 501 arranged along the first direction D1 at adjacent edge positions of the first potential signal line 331 and the extension electrode 332 is at least greater than a width of two second gate lines. The first vias 501 may also be arranged at edge positions of one side of the extension electrode 332 close to the second potential signal line 333 and edge positions of one side of the first potential signal line 331 away from the notch region. However, this embodiment is not limited thereto.

In this exemplary embodiment, display uniformity of the display substrate may be improved by using the second metal structure (including the first potential signal line and the extension electrode), the semiconductor structure, and a second gate line to form a capacitor to compensate a loading capacitance. Furthermore, space occupied by the first capacitance compensation unit may be reduced by providing the first vias at edge positions of the first potential signal line and the extension electrode along the second direction, thereby facilitating a design of a narrow border.

At least one embodiment of the present disclosure further provides a preparation method of a display substrate, which is used for preparing the display substrate as described above. The preparation method of this embodiment includes: providing a base substrate; and in a capacitance compensation region located between a display region and a notch region, forming a semiconductor structure, a first metal structure, and a second metal structure on the base substrate sequentially. The semiconductor structure and the first metal structure are insulated from each other, and the first metal structure and the second metal structure are insulated from each other. A plurality of first vias are provided in an insulation layer between the semiconductor structure and the second metal structure, and the second metal structure is connected with the semiconductor structure through the plurality of first vias. The first metal structure includes a plurality of second gate lines extending along a first direction, the second gate lines being connected with a plurality of first gate lines in the display region. An orthographic projection of a second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate. The second gate line forms a capacitor together with the second metal structure and the semiconductor structure. The plurality of first vias are arranged along the first direction, and a distance between two adjacent first vias is at least greater than a sum of widths of two second gate lines in a second direction perpendicular to the first direction.

In some exemplary implementation modes, the preparation method may further include: sequentially forming a semiconductor layer, a first conductive layer, a second conductive layer, and a third conductive layer on the base substrate in the display region. The semiconductor layer includes active layers of a plurality of transistors; the first conductive layer includes gate electrodes of the plurality of transistors, a first electrode of a storage capacitor, and a first gate line connected with a gate electrode; the second conductive layer includes a second electrode of the storage capacitor; the third conductive layer includes source electrodes and drain electrodes of the plurality of transistors. The semiconductor structure is disposed on a same layer as the semiconductor layer, and the first metal structure is disposed on a same layer as the second conductive layer; the second metal structure is disposed on a same layer as the third conductive layer. A second gate line included in the first metal structure is connected with a corresponding first gate line in the first conductive layer.

Regarding to the preparation process of the display substrate provided in this embodiment, reference may be made to descriptions of the aforementioned embodiments, and thus will not be repeated herein.

Figure 17:
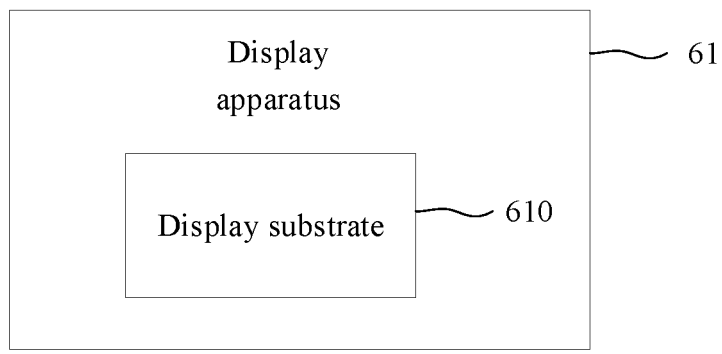
FIG. 17 is a schematic diagram of a display apparatus according to at least one embodiment of the present disclosure.

FIG. 17 is a schematic diagram of a display apparatus according to at least one embodiment of the present disclosure. As shown in FIG. 17, a display apparatus 61 according to this embodiment includes a display substrate 610. The display substrate 610 is the display substrate according to the embodiment described above, and their implementation principles and implementation effects are similar, and will not be repeated herein. In some examples, the display substrate may be an Organic Light Emitting Diode (OLED) display substrate. In some examples, the display apparatus may be any product or component with a display function, such as an OLED display apparatus, a mobile phone, a tablet computer, a television, a display, a notebook computer, a digital photo frame, or a navigator. This embodiment is not limited thereto.

Although the implementation modes disclosed in the present disclosure are described as above, the described contents are only implementation modes which are used in order to facilitate understanding of the present disclosure, and are not intended to limit the present disclosure. Any skilled person in the art to which the present disclosure pertains may make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising:
 a display region, a notch region, and a capacitance compensation region, wherein the display region at least partially surrounds the notch region, and the capacitance compensation region is located between the display region and the notch region; a plurality of first gate lines is provided in the display region;
 a first capacitance compensation unit is provided in the capacitance compensation region;
 the first capacitance compensation unit comprises a semiconductor structure, a first metal structure, and a second metal structure disposed on a base substrate sequentially; the semiconductor structure and the first metal structure are insulated from each other, and the first metal structure and the second metal structure are insulated from each other; a plurality of first vias are provided in an insulation layer between the semiconductor structure and the second metal structure, and the second metal structure is connected with the semiconductor structure through the plurality of first vias;

the first metal structure comprises a plurality of second gate lines extending along a first direction, and at least one of the second gate lines is connected with a corresponding first gate line; an orthographic projection of a second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate; the second gate line forms a capacitor together with the second metal structure and the semiconductor structure; and the plurality of first vias are arranged along the first direction, and in a second direction perpendicular to the first direction, a distance between two adjacent first vias is at least greater than a sum of widths of two second gate lines, wherein the second metal structure at least comprises a first potential signal line extending along the first direction, and wherein the first potential signal line in the capacitance compensation region has a main body portion and an extension portion; the main body portion extends along the first direction, the extension portion extends along the second direction, and one end of the extension portion close to the notch region is connected with the main body portion; a length of the extension portion in the first direction increases gradually and then decreases along a direction away from the notch region.

2. The display substrate according to claim 1, wherein the first metal structure comprises N second gate lines extending along the first direction; and in the second direction perpendicular to the first direction, the distance between the two adjacent first vias is at least greater than the sum of the widths of the two second gate lines and less than a sum of widths of the N second gate lines, wherein N is an integer greater than 4.

3. The display substrate according to claim 2, wherein the capacitance compensation region is further provided with a second capacitance compensation unit, the second capacitance compensation unit comprises a third metal structure and a fourth metal layer structure that are disposed on the base substrate sequentially and insulated from each other; the third metal structure and the first metal structure are structures on a same layer, and the fourth metal structure and the second metal structure are structures on a same layer; an orthographic projection of the third metal structure on the base substrate is at least partially overlapped with an orthographic projection of the fourth metal structure on the base substrate, and the third metal structure and the fourth metal structure form a capacitor.

4. The display substrate according to claim 2, wherein, the second metal structure at least comprises a first potential signal line extending along the first direction.

5. The display substrate according to claim 1, wherein the first metal structure comprises N second gate lines extending along the first direction, N being an integer greater than 1; and in the second direction perpendicular to the first direction, the distance between the two adjacent first vias is greater than a sum of widths of the N second gate lines.

6. The display substrate according to claim 1, wherein the semiconductor structure comprises at least one semiconductor block, the plurality of first vias are respectively located on an edge of one side or on edges of both opposite sides of the at least one semiconductor block in the second direction.

7. The display substrate according to claim 6, wherein the semiconductor structure comprises a plurality of semiconductor blocks arranged along the first direction sequentially, a length of at least one semiconductor block along the first direction ranging from 10 microns to 300 microns.

8. The display substrate according to claim 1, wherein the orthographic projection of the second metal structure on the base substrate covers the orthographic projection of the semiconductor structure on the base substrate.

9. The display substrate according to claim 1, wherein a width of at least one second gate line comprised in the first metal structure is different from a width of an adjacent second gate line.

10. The display substrate according to claim 1, wherein the capacitance compensation region is further provided with a second capacitance compensation unit, the second capacitance compensation unit comprises a third metal structure and a fourth metal layer structure that are disposed on the base substrate sequentially and insulated from each other; the third metal structure and the first metal structure are structures on a same layer, and the fourth metal structure and the second metal structure are structures on a same layer; an orthographic projection of the third metal structure on the base substrate is at least partially overlapped with an orthographic projection of the fourth metal structure on the base substrate, and the third metal structure and the fourth metal structure form a capacitor.

11. The display substrate according to claim 1, further comprising a border region located at a periphery of the display region and away from the notch region; wherein a width of a first potential signal line in the capacitance compensation region is greater than a width of a first potential signal line in the border region.

12. The display substrate according to claim 1, wherein the second metal structure further comprises an extension electrode, and the extension electrode is connected with the first potential signal line through a plurality of connection electrodes.

13. The display substrate according to claim 12, wherein a plurality of second vias are provided in an insulation layer between a film layer where the plurality of connection electrodes are located and the second metal structure, and the extension electrode and the first potential signal line are respectively connected with the connection electrodes through the plurality of second vias;

the first vias and the second vias are spaced apart from each other and arranged along the first direction.

14. The display substrate according to claim 1, wherein the first potential signal line is a low potential power line or a high potential power line.

15. The display substrate according to claim 1, wherein a plurality of sub-pixels arranged regularly are provided in the display region, at least one sub-pixel comprises a light emitting element and a drive circuit for driving the light emitting element to emit light, and the drive circuit comprises a plurality of transistors and a storage capacitor;

the display region comprises a base substrate, and a semiconductor layer, a first conductive layer, a second conductive layer, and a third conductive layer which are disposed on the base substrate sequentially;

the semiconductor layer comprises active layers of the plurality of transistors;

the first conductive layer comprises gate electrodes of the plurality of transistors, a first electrode of the storage capacitor, and a first gate line connected with a gate electrode;

the second conductive layer comprises a second electrode of the storage capacitor;

the third conductive layer comprises source electrodes and drain electrodes of the plurality of transistors;

the semiconductor structure is disposed on a same layer as the semiconductor layer, and the first metal structure is disposed on a same layer as the second conductive layer; the second metal structure is disposed on a same layer as the third conductive layer;

a second gate line comprised in the first metal structure is connected with a corresponding first gate line in the first conductive layer.

16. A display apparatus, comprising the display substrate according to claim 1.

17. A preparation method of a display substrate, wherein the display substrate comprises a display region, a notch region, and a capacitance compensation region, the display region at least partially surrounds the notch region, and the capacitance compensation region is located between the display region and the notch region;

the preparation method comprises:

providing a base substrate; and in the capacitance compensation region, forming a semiconductor structure, a first metal structure, and a second metal structure on the base substrate sequentially; wherein the semiconductor structure and the first metal structure are insulated from each other, the first metal structure and the second metal structure are insulated from each other, a plurality of first vias are provided in an insulation layer between the semiconductor structure and the second metal structure, and the second metal structure is connected with the semiconductor structure through the plurality of first vias; the first metal structure comprises a plurality of second gate lines extending along a first direction, and the second gate lines are respectively connected with a plurality of first gate lines in the display region; an orthographic projection of a second gate line on the base substrate is at least partially overlapped with an orthographic projection of the second metal structure on the base substrate, and the orthographic projection of the second gate line on the base substrate is at least partially overlapped with an orthographic projection of the semiconductor structure on the base substrate; the second gate line forms a capacitor together with the second metal structure and the semiconductor structure; the plurality of first vias are arranged along the first direction, and in a second direction perpendicular to the first direction, a distance between two adjacent first vias is at least greater than a sum of widths of two second gate lines, wherein the second metal structure at least comprises a first potential signal line extending along the first direction, and wherein the first potential signal line in the capacitance compensation region has a main body portion and an extension portion; the main body portion extends along the first direction, the extension portion extends along the second direction, and one end of the extension portion close to the notch region is connected with the main body portion; a length of the extension portion in the first direction increases gradually and then decreases along a direction away from the notch region.

18. The preparation method according to claim 17, further comprising: in the display region, sequentially forming a semiconductor layer, a first conductive layer, a second conductive layer, and a third conductive layer on the base substrate;

wherein the semiconductor layer comprises active layers of a plurality of transistors;

the first conductive layer comprises gate electrodes of the plurality of transistors, a first electrode of a storage capacitor, and a first gate line connected with a gate electrode;

the second conductive layer comprises a second electrode of the storage capacitor;

the third conductive layer comprises source electrodes and drain electrodes of the plurality of transistors;

the semiconductor structure is disposed on a same layer as the semiconductor layer, and the first metal structure is disposed on a same layer as the second conductive layer; the second metal structure is disposed on a same layer as the third conductive layer; and a second gate line comprised in the first metal structure is connected with a corresponding first gate line in the first conductive layer.

* * * * *